United States Patent
Dunklee et al.

(10) Patent No.: US 10,254,309 B2
(45) Date of Patent: Apr. 9, 2019

(54) TEST APPARATUS HAVING A PROBE CORE WITH A LATCH MECHANISM

(71) Applicant: CELADON SYSTEMS, INC., Apple Valley, MN (US)

(72) Inventors: John L. Dunklee, Tigard, OR (US); William A. Funk, Lakeville, MN (US); Bryan J. Root, Apple Valley, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 330 days.

(21) Appl. No.: 15/108,237

(22) PCT Filed: Dec. 31, 2014

(86) PCT No.: PCT/US2014/072943
§ 371 (c)(1),
(2) Date: Jun. 24, 2016

(87) PCT Pub. No.: WO2015/103365
PCT Pub. Date: Jul. 9, 2015

(65) Prior Publication Data
US 2016/0320428 A1    Nov. 3, 2016

Related U.S. Application Data

(60) Provisional application No. 61/922,580, filed on Dec. 31, 2013.

(51) Int. Cl.
*G01R 31/28* (2006.01)
*G01R 1/067* (2006.01)

(52) U.S. Cl.
CPC ..... *G01R 1/06705* (2013.01); *G01R 31/2863* (2013.01)

(58) Field of Classification Search
CPC .. G01R 1/07307; G01R 1/07385; G01R 1/36; G01R 3/00; G01R 31/2601; G01R 31/2889
See application file for complete search history.

(56) References Cited

U.S. PATENT DOCUMENTS

2003/0011393 A1    1/2003   Farnworth et al.
2003/0049953 A1    3/2003   Sausen
(Continued)

FOREIGN PATENT DOCUMENTS

| CN | 101598743 A | 12/2009 |
|---|---|---|
| CN | 203092511 U | 7/2013 |
| WO | 2013006768 | 1/2013 |

OTHER PUBLICATIONS

International Search Report for international application No. PCT/US2014/072943, dated Mar. 20, 2015 (3 pages).

*Primary Examiner* — Tung X Nguyen
(74) *Attorney, Agent, or Firm* — Hamre, Schumann, Mueller & Larson, P.C.

(57) ABSTRACT

A latch assembly that can lock and unlock a probe core with respect to a circuit board is provided. The latch assembly can engage with the probe core to align the probe core with respect to a circuit board, and press down the probe core against the circuit board by rotating to lock the probe core with the circuit board. An installation tool is provided to grip or release the probe core to/from a latch assembly or a probe core carrier. The installation tool can align with the probe core and/or the latch assembly to lock and unlock the probe core with respect to a circuit board.

22 Claims, 21 Drawing Sheets

(56) References Cited

U.S. PATENT DOCUMENTS

2003/0178988 A1* 9/2003 Kim ................ G01R 31/2887
                                              324/750.19
2011/0204912 A1    8/2011 Root et al.
2012/0038380 A1    2/2012 Root et al.
2012/0319711 A1* 12/2012 Hung ................ G01R 1/07371
                                              324/750.16

* cited by examiner

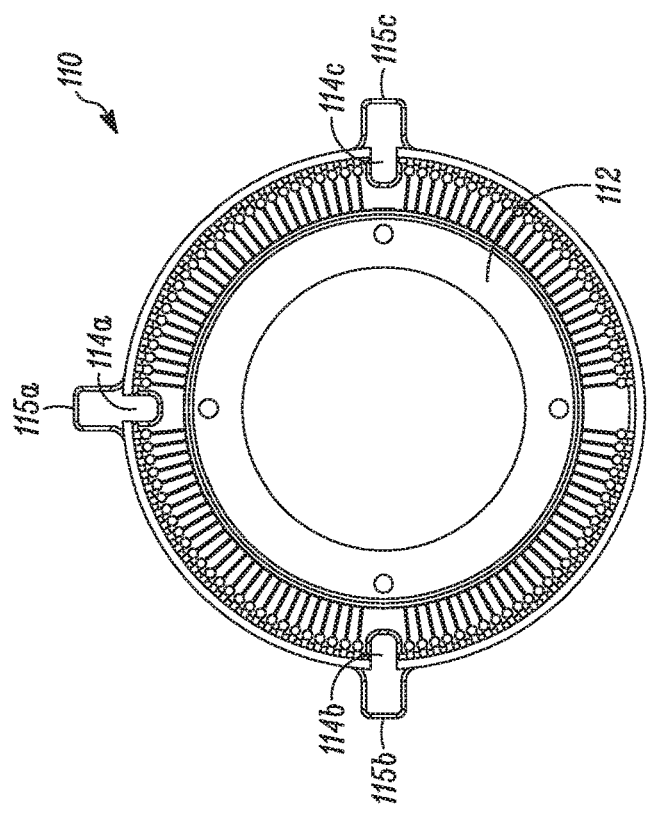
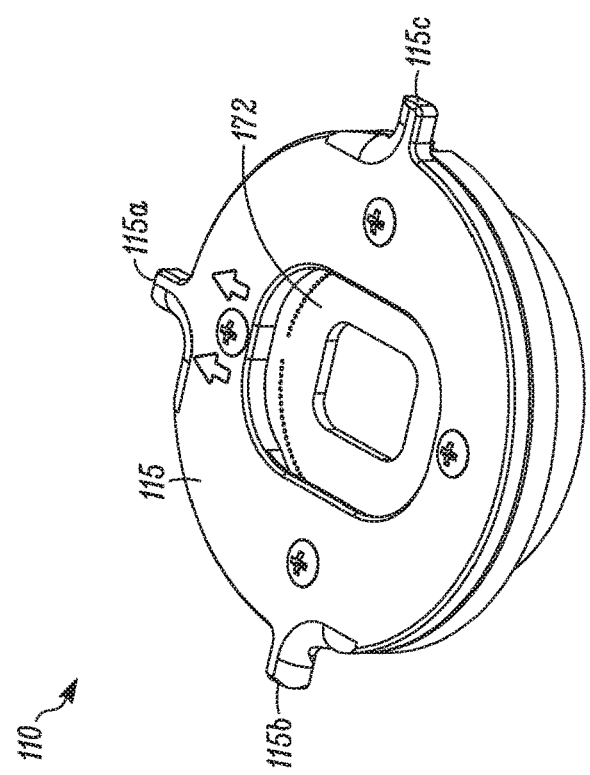
FIG. 3b
FIG. 3a

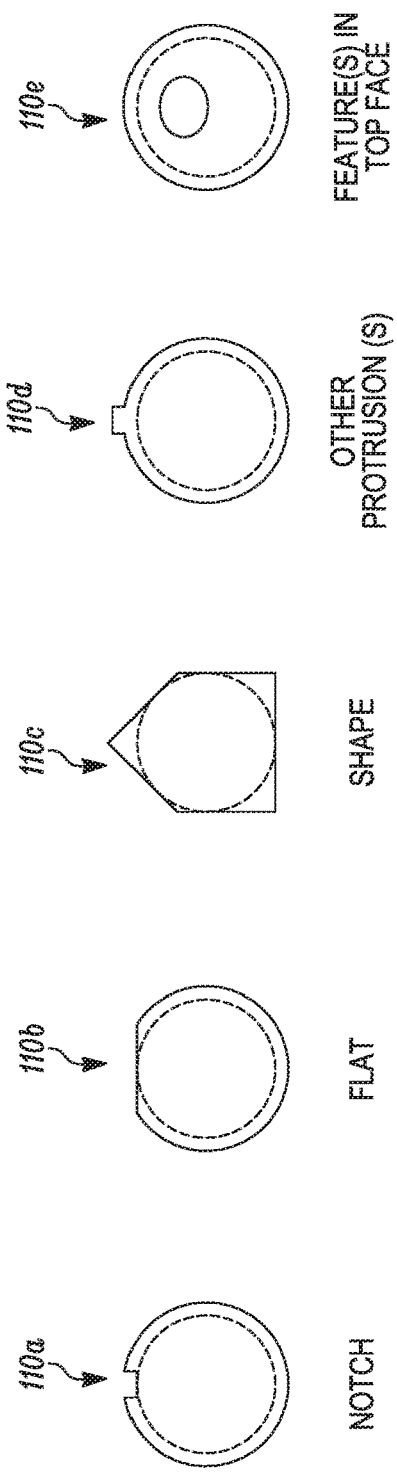

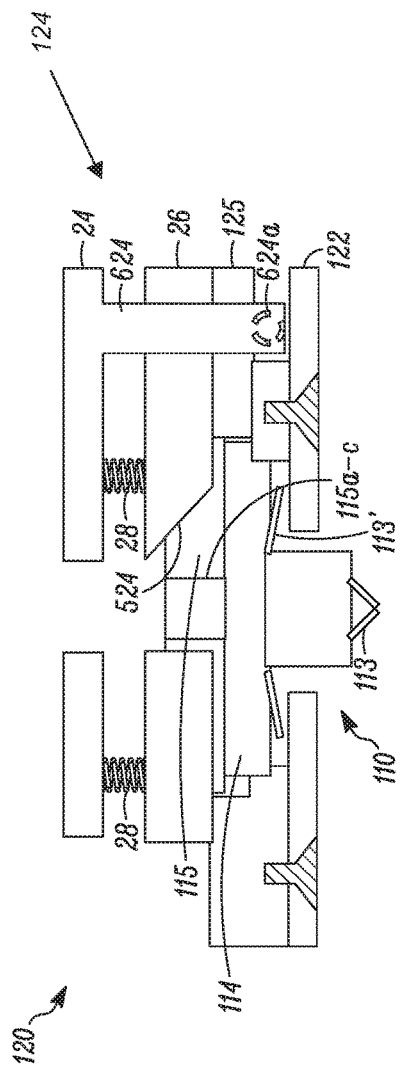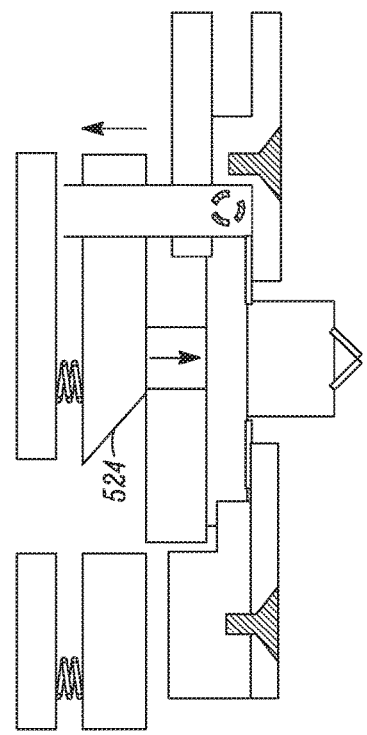

HANDLE ASSEMBLY DOWN POSITION

HANDLE ASSEMBLY UP POSITION

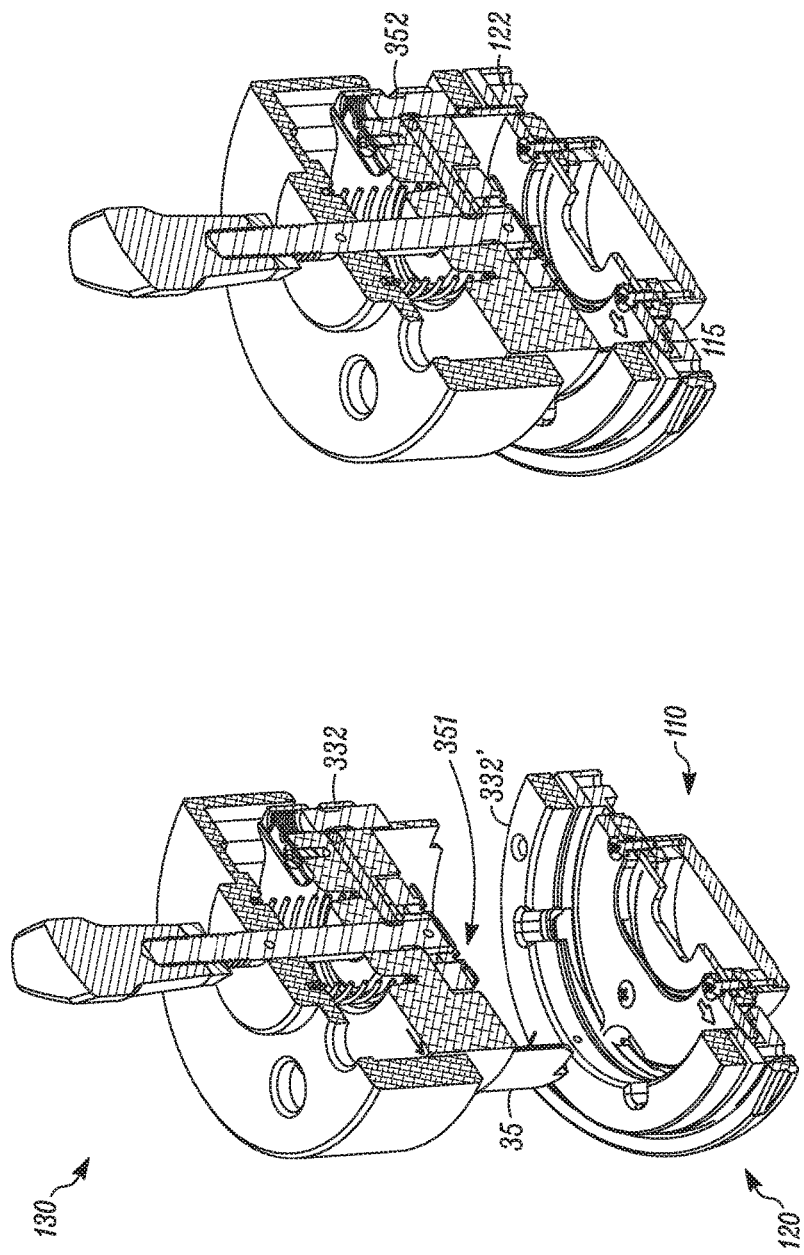

FURTHER UPWARD MOTION OF THE HANDLE LIFTS THE TOOL AND CORE OUT OF THE LATCH ASSEMBLY. AFTER 1MM TRAVEL, THE SLEEVE LATCH PIN LOCKS THE SLEEVE IN POSITION

AS HANDLE IS LIFTED, IT LIFTS PROBE CORE. THE COMPRESSION SPRING KEEPS SLEEVE PRESSED DOWNWARD UNTIL THE PROBE CORE MAKES CONTACT.

TEST APPARATUS HAVING A PROBE CORE WITH A LATCH MECHANISM

FIELD

This disclosure relates generally to test equipment, particularly for testing a device under test (e.g., a semiconductor device). More particularly, the disclosure relates to a probe apparatus structured as a probe core that is used with test equipment for electrically probing a device under test, such as a semiconductor wafer.

BACKGROUND

The semiconductor industry continues to have a need to access many electronic devices on a semiconductor wafer. As the semiconductor industry grows and devices become smaller and more complex, many electrical devices, most commonly semiconductor devices and on-wafer electrical interconnects, must be electrically tested, for example, for leakage currents and extremely low operating currents while the devices are in wafer form. In addition, the currents and device characteristics are often required to be evaluated over a wide temperature range to understand how temperature affects a device. Also, due to continuous and rapid changes in semiconductor technology, the size of semiconductor devices and their electrical contact pads keep getting smaller.

To effectively measure semiconductor devices in wafer form, probes are used to contact conductive pads on the surface of the wafer. These probes are, in turn, electrically connected to test instruments. Often, additional electrical interconnection components such as circuit boards make up part of the connection between the probes and test instruments. To minimize degradation of electrical measurements, the probes and interconnection components must be designed to isolate the measurement signal from external electrical interference, leakage currents through dielectric materials, parasitic capacitance, triboelectric noise, piezoelectric noise, and dielectric absorption, etc.

A typical probe card used for wafer level electrical test of semiconductor devices can include probes permanently bonded to a circuit board that is designed to interface to a particular test instrument. Changes in contact pad size, contact pad layout, or test instrument interface require the entire probe card assembly to be replaced. An alternative approach is to use a probe core that interfaces to a circuit board that, in turn, is designed to interface to a particular test instrument. Changes to the contact pad size or contact pad layout require the probe core to be replaced. Changes to the test instrument interface require the circuit board to be replaced.

Accordingly, there continues to be a need for improved semiconductor test equipment for electrically probing semiconductor devices, such as semiconductor wafers.

SUMMARY

This disclosure relates generally to test equipment, particularly for testing a device under test (e.g., a semiconductor device). More particularly, the disclosure relates to a probe apparatus structured as a probe core that is used with test equipment for electrically probing a device under test, such as a semiconductor wafer.

Test equipment is described that is useful, for example, in systems to test a semiconductor device. More particularly, a probe apparatus is described that can be used to electrically probe a device under test, such as a semiconductor wafer. Generally, the probe apparatus is a probe core that can be locked and unlocked with respect to another test equipment or component, such as a circuit board, and where the probe core has one or more probes that can probe the device and are electrically connected to contacts that can transmit signals from the probe core, for example, to other testing equipment.

The embodiments described therein provide a latch assembly that can lock and unlock a probe core with respect to a circuit board. The latch assembly can mate the probe core to the circuit board by accurately positioning the probe core to the circuit board. In some embodiments, the latch assembly can engage with the probe core to align the probe core with respect to a circuit board, and press down the probe core against the circuit board by rotating one or more components of the latch assembly to lock the probe core with the circuit board.

In some embodiments, the probe core probes can be wire needles that can have electrical connections and contacts to other testing equipment.

In some embodiments, a probe core includes a top plate having an engagement element that can be aligned with the latch assembly and engage with the latch assembly to be pressed down by rotating one or more components of the latch assembly. In some embodiments, the engagement element can be an ear element that is a protrusion projecting radially out of a top plate of the probe core.

In some embodiments, an installation tool is provided to grip or release a probe core to/from a latch assembly or a probe core carrier. The installation tool can align with the probe core and/or the latch assembly to lock and unlock the probe core with respect to a circuit board. In some embodiments, the installation tool can unlock the probe core with respect to a circuit board or a carrier and grip the probe core at the same time. In some embodiments, the installation tool can lock the probe core to the circuit board or the carrier and be released from the probe core at the same time.

The embodiments described herein can allow a probe core to be easily installed and removed with low risk of damage. The embodiments described herein can also provide easily replaceable probe cores and an intermediate interface between the probe cores and a circuit card without degrading the electrical measurement.

A probe apparatus for testing a device under test is disclosed. The apparatus includes a probe core including a top plate, a wire guide, a plurality of probe wires, and a probe tile; a circuit board; and a latch assembly for removably securing the probe core to the circuit board. The latch assembly includes a clamping mechanism configured to press the probe core against the circuit board; and a guide plate disposed between the clamping mechanism and the circuit board, the guide plate configured to orient the probe core with respect to the circuit board in a specific position.

A probe apparatus for testing a device under test is disclosed. The apparatus includes a circuit board having an engagement assembly; and a probe core. The probe core includes a top plate including one or more engagement elements configured to provide a coarse alignment of the probe core with respect to the circuit board when the probe core is clamped to the circuit board; a wire guide including one or more notches positioned at a periphery of the wire guide, the one or more notches configured to provide a fine alignment when the probe core is clamped to the circuit board; a plurality of probe wires; and a probe tile. The probe core is engageable with the engagement assembly.

A probe core configured for use in a probe apparatus for testing a device under test is disclosed. The probe core includes a top plate including one or more engagement elements configured to provide a coarse alignment of the probe core with respect to a circuit board when the probe core is clamped to the circuit board; a wire guide including one or more notches positioned at a periphery of the wire guide, the one or more notches configured to provide a fine alignment when the probe core is clamped to the circuit board; a plurality of probe wires; and a probe tile. The probe core is engageable with an engagement assembly.

A method for latching a probe core to a device is disclosed. The method includes applying a force to a drive plate using an installation tool, the drive plate being configured to correspondingly rotate a latch plate; forcing the latch plate against an engagement element on the probe core thereby clamping the probe core to the device; and removing the installation tool from the probe core when the probe core is clamped to the device.

BRIEF DESCRIPTION OF THE DRAWINGS

References are made to the accompanying drawings that form a part of this disclosure, and which illustrate the embodiments in which the systems and methods described in this specification can be practiced.

FIG. 3a shows a side view of a probe core, according to some embodiments.

FIG. 3b shows a bottom view of the probe core of FIG. 3a, according to some embodiments.

FIG. 4a illustrates a first variant of the probe core of FIG. 1a, according to some embodiments.

FIG. 4b illustrates a second variant of the probe core of FIG. 1a, according to some embodiments.

FIG. 4c illustrates a third variant of the probe core of FIG. 1a, according to some embodiments.

FIG. 4d illustrates a fourth variant of the probe core of FIG. 1a, according to some embodiments.

FIG. 4e illustrates a fifth variant of the probe core of FIG. 1a, according to some embodiments.

FIG. 6a is a side schematic view of the probe test equipment of FIG. 1a in an unclamped position, according to some embodiments.

FIG. 6b is a side schematic view of the probe test equipment of FIG. 1a in a clamped position, according to some embodiments.

FIG. 10a is a sectional view of the installation tool of FIG. 9a that engages with a probe core and a latch assembly, according to some embodiments.

FIG. 10b is another sectional view of the installation tool of FIG. 9a that engages with a probe core and a latch assembly, according to some embodiments.

Like reference numbers represent like parts throughout.

DETAILED DESCRIPTION

This disclosure relates generally to test equipment, particularly for testing a device under test (e.g., a semiconductor device). More particularly, the disclosure relates to a probe apparatus structured as a probe core that is used with test equipment for electrically probing a device under test, such as a semiconductor wafer.

Figure 1A:
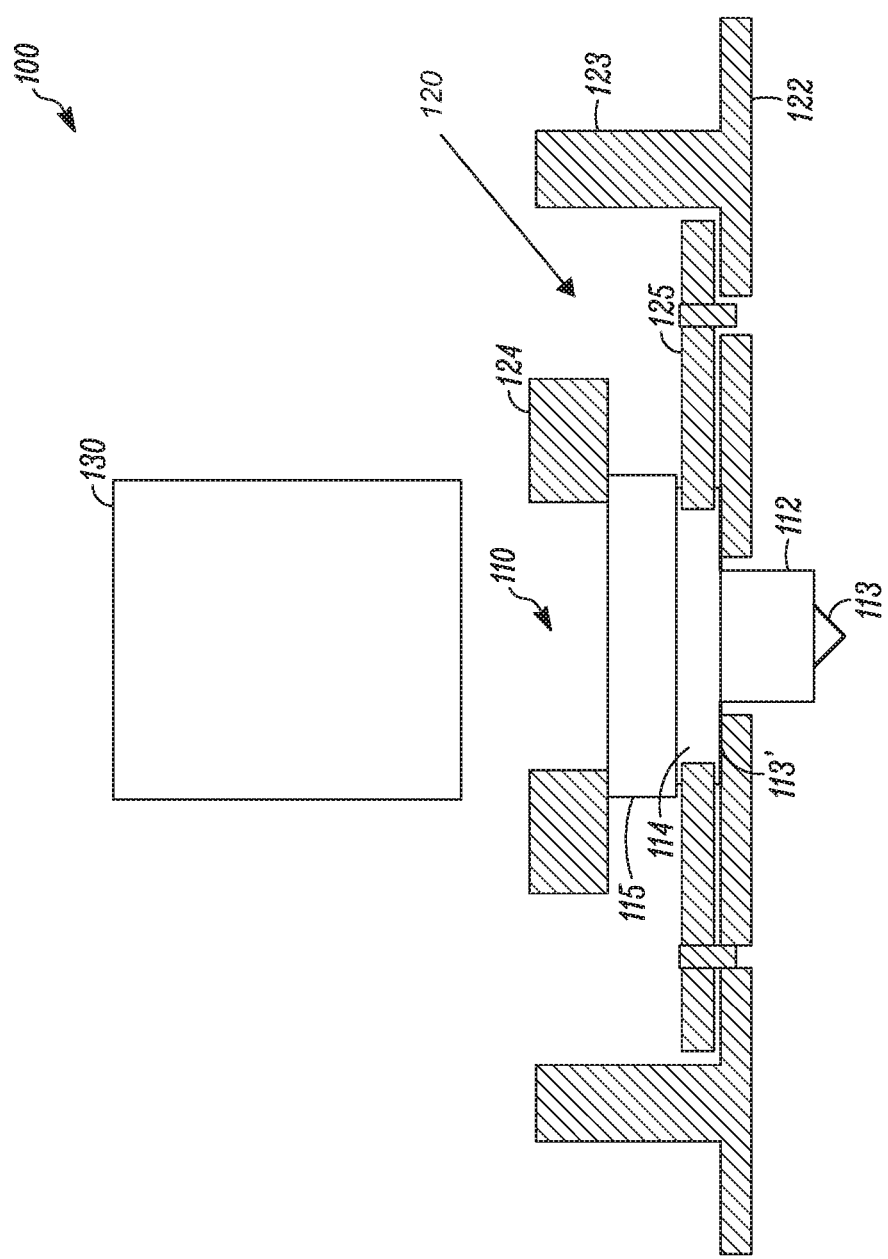
FIG. 1a is a sectional view of a probe test equipment, according to some embodiments.

FIG. 1a is a sectional view of probe test equipment 100, according to some embodiments. The probe test equipment 100 includes a probe core 110, a circuit board 122, and a latch assembly 120 to receive the probe core 110 and connect to the probe core 110. Some embodiments of the latch assembly 120 are discussed in additional detail in accordance with FIGS. 6a-6b below, and/or FIGS. 12a-12c. An installation tool 130 is configured to grip or release the probe core 110 to/from the latch assembly 120.

The latch assembly 120 includes a clamping mechanism 124 for clamping the probe core 110 onto the circuit board 122 and a guide plate 125. The installation tool 130 can actuate the clamping mechanism 124 to lock or unlock the probe core 110 to/from the circuit board 122. In some embodiments, the installation tool 130 can actuate the clamping mechanism 124 to lock or unlock the probe core 110 to/from a probe core carrier (e.g., probe core carrier 140 as shown and described in accordance with FIG. 11). The probe test equipment 100 can further include a stiffener frame 123.

The probe core 110 includes a probe tile 112, probe wires 113 having one end extending through the probe tile 112, a wire guide 114 configured to guide probe tails 113' of the probe wires 113, and a top plate 115 that covers the wire guide 114. The wire guide 114 can be generally cylindrical in geometry, according to some embodiments. The top plate 115 can have a variable geometry, according to some embodiments. Examples of possible geometries for the top plate 115 are shown and described in accordance with FIGS. 4a-4e below, though it is to be appreciated that one or more other geometries for the top plate 115 may function according to the principles described herein.

Figure 1B:
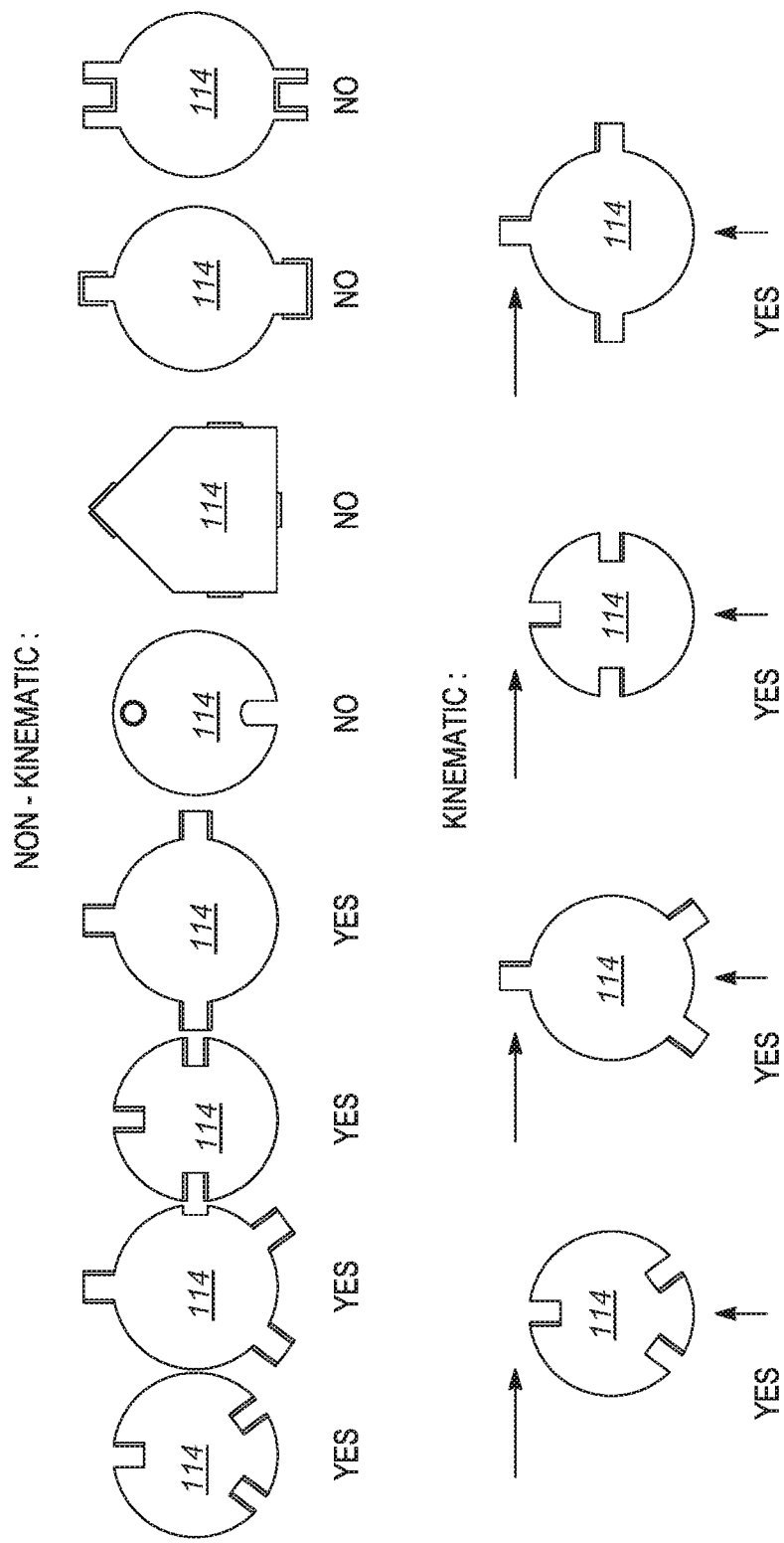
FIG. 1b shows various geometries for the wire guide engageable with the guide plate of FIG. 1a, according to some embodiments.

A fine alignment can be provided between the probe core 110 and the circuit board 122 via the wire guide 114 of the probe core 110 and the guide plate 125 of the latch assembly 120. FIG. 1b illustrates top views of a variety of guide arrangements between the wire guide 114 and the guide plate 125 that can have respective varied geometries engaged with each other. The engagement between the wire guide 114 and the guide plate 125 can orient the probe core 110 with respect to the circuit board 122 (or other device such as probe core carrier 140 of FIG. 11) at a specific position. The guide plate 125 is not illustrated in FIG. 1b. It is to be appreciated that the guide plate 125 would follow a similar geometry to the protrusions or cavities as illustrated. The embodiments shown in FIG. 1b with "Yes" can keep the center of the wire guide centered as it changes size over temperature. Both non-kinematic and kinematic approaches are shown. In some embodiments, the guide arrangement may not require the degree of precision that can be achieved with a kinematic approach, and so the added complexity of biasing forces needed by kinematic contacts can be avoided. In some embodiments, to provide suitable stability over a range of temperatures, a kinematic arrangement that contacts a ceramic/metal probe subassembly such as, for example, the probe tile 112 can be provided.

In some embodiments, a tight clearance, for example, about 25-50 μm, between the guide plate 125 and the wire guide 114, can be provided. Contact areas between the guide plate 125 and the wire guide 114 can be minimized through the use of, for example, chamfers or radii on the guide plate 125 and/or the wire guide 114 to minimize the potential for binding. In some embodiments, one or more coarse alignment features can be provided for the probe core 110, the latch assembly 120, and/or the tool 130 that can position the guide plate 125 and the wire guide 114 close and keep them parallel to reduce the risk of binding.

The probe core 110 can be clamped to the circuit board 122 (or other device such as probe carrier 140 of FIG. 11) by, for example, the clamping mechanism 124 to force the top plate 115 of the probe core 110 against the circuit board 122.

Figure 1C:
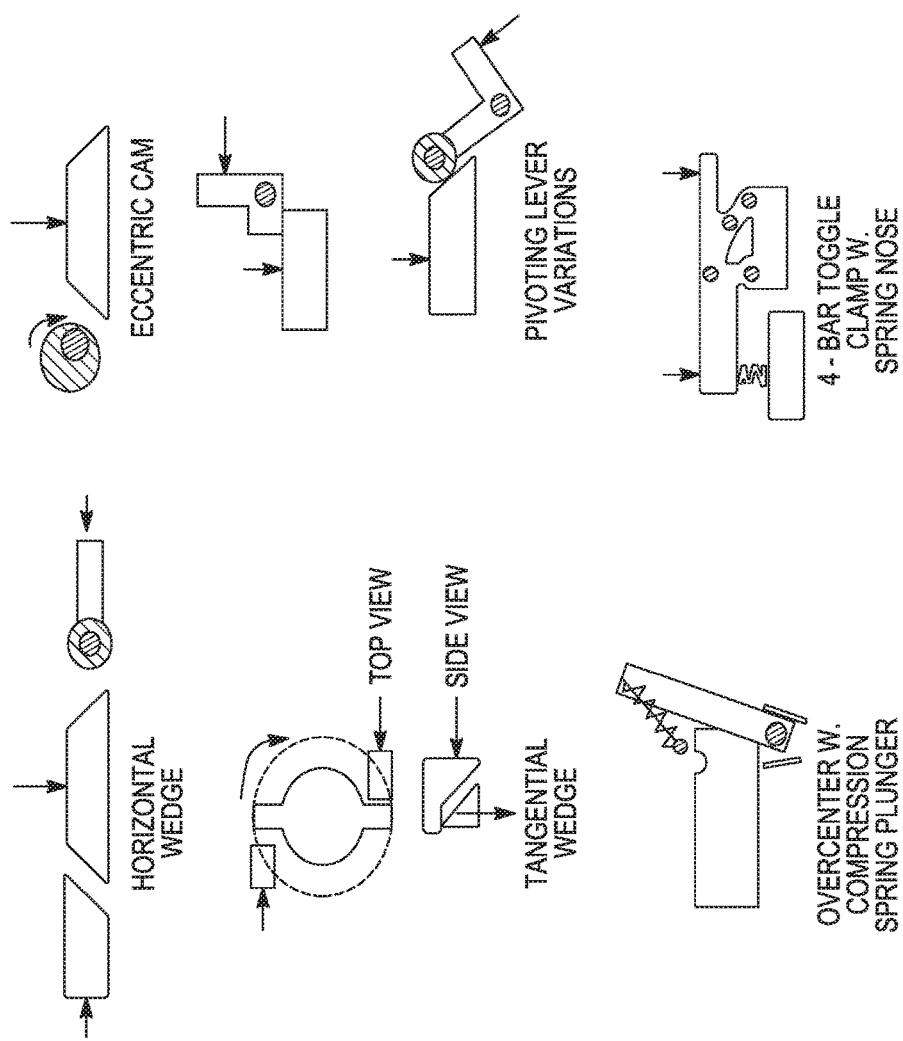
FIG. 1c illustrates various engagements between the clamping mechanism and the top plate of the probe core of FIG. 1a, according to some embodiments.

FIG. 1c illustrates the engagement between the clamping mechanism 124 and the top plate 115 for various geometries and mechanisms. In some embodiments, the engagement can be designed to be always energized (e.g., where the clamping mechanism 124 has to be pried apart to release the probe core 110). In other embodiments, the engagement can be switchable between "on" and "off." In some embodiments, the clamping mechanism 124 can be pried apart as a protective sleeve portion of the installation tool 130 is inserted to grip or release the probe core 110 to/from the latch assembly 120. The various embodiments can be manipulated in order to move the probe core 110 toward the circuit board 122. The horizontal wedge embodiment can be forced downward when a force is applied to either or both sides of the wedge. The eccentric cam embodiment can be forced downward by a rotational motion of the cam. A tangential wedge can be used to force the probe core 110 toward the circuit board 122 by rotation causing a ramped wedge to translate and through contact with another ramped wedge force the probe core 110 toward the circuit board 122. A pivoting lever variation is illustrated in which rotation of a lever can cause contact with an upper surface of the probe core 110 forcing the probe core 110 downward toward the circuit board 122. An overcenter with compression spring plunger embodiment can be used to apply a rotational force which in turn causes a spring plunger to force the probe core 110 downward toward the circuit board 122. In another embodiment, a four-bar toggle clamp with a spring nose can receive a downward force, which can in turn be applied to an upper surface of the probe core 110 to force the probe core 110 downward toward the circuit board 122.

Figure 2:
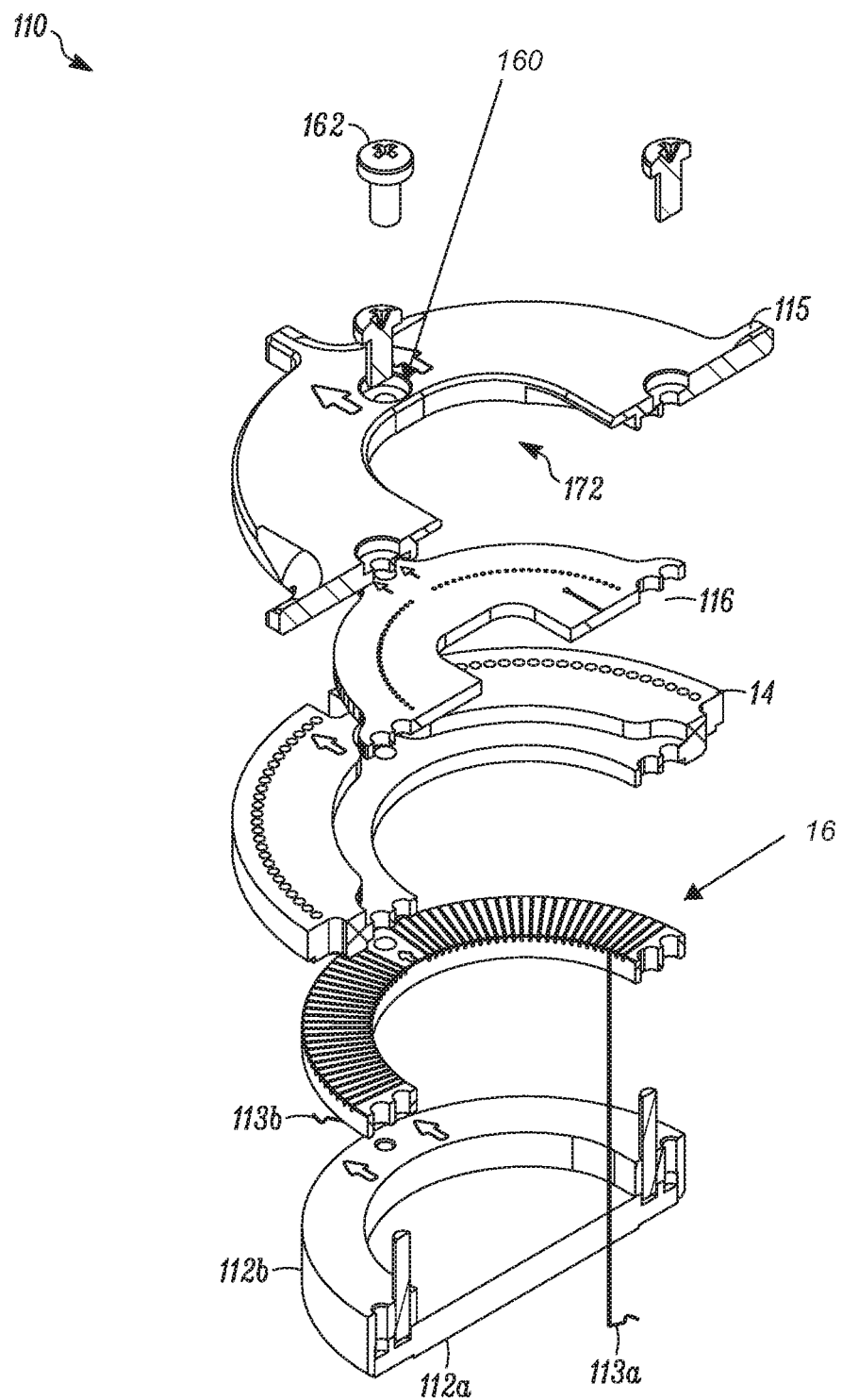
FIG. 2 is a sectional view of the probe core of FIG. 1a, according to some embodiments.

FIG. 2 is a sectional view of the probe core 110, according to some embodiments. In the embodiment shown in FIG. 2, the probe tile 112 includes a plate 112a defining channels for receiving the probe wires 113 and a component 112b bonded to the plate 112a. The component 112b has a ring shape and defines alignment openings 160 for receiving alignment pins 162. The plate 112 can be made of, for example, a ceramic material. The component 112b can be made of, for example, a metallic material.

The wire guide 114 includes an upper wire guide 14 and a lower wire guide 16 that define channels therebetween for guiding the probe wires 113. The probe wires 113 are clamped between the upper wire guide 14 and the lower wire guide 16. The probe wires 113 each have a first end 113a extending out of the plate 112a to form a probe tip and a second, opposite end 113b. In some embodiments, the wire guide 114 is shaped to allow the probe wires 113 to extend with a tilted angle toward the second end 113b thereof. The second end 113b is configured to contact a respective pad on the circuit board 122. In some embodiments, the second end 113b can act as an elastic contact for a positive mechanical stop. In some embodiments, the second end 113b can form dimpled probe tails that can be, for example, "v" or "u" shaped. The dimpled probe tails can be plated by, for example, gold. The second end 113b of the probe wires 113 can be electrically connected to identification printed wiring board ("ID PWB board") 116. The ID PWB board 116 can include identification ("ID") devices, passive or active components for performing diagnostic tests, and/or devices for improving signal integrity. The ID devices can include, for example, an erasable programmable read only memory (EPROM), and a resistor. The passive or active components can include, for example, a diode, a resistor, and/or a capacitor. The devices for improving signal integrity can include, for example, a resistor, a capacitor, and/or an inductor. In some embodiments, the probe wire 113 may consist of the second end 113b terminated to the ID PWB board 116.

The top plate 115 defines a pocket 172 that has a recessed cavity at a center underside of the top plate 115. The alignment pins 162 are received by the alignment openings 160 to align the components of the probe core 110. The components of the probe core 110, such as, for example, the top plate 115 and the wire guide 114, each can have a hole and/or a slot for alignment with the alignment pins 162.

FIGS. 3a and 3b illustrate a side view and a bottom view (respectively) of the probe core 110, according to some embodiments. The top plate 115 of the probe core 110 has a generally round shape and engagement elements 115a-115c (in the illustrated embodiment the engagement elements 115a-115c are also referred to as "ear elements" 115a-115c) positioned at the periphery of the top plate 115. The ear elements 115a-115c on the top plate 115 can provide a positive orientation, act as coarse alignment features, and can be engaged by a latch such as, for example, the clamping mechanism 124 of FIG. 1a, to push the second end 113b of the probe wires 113 against the circuit board 122. The wire guide 114 of the probe core 110 includes notches 114a-114c positioned at the periphery of the wire guide 114. The notches 114a-114c can provide fine alignment features for the wire guide 114. In some embodiments, the notches 114a-114c can engage with nubs such as nubs 114a'-114c' shown in FIG. 7 on the guide plate 125 to provide a fine alignment therebetween. The engagement between the notches 114a-114c and the nubs 114a'-114c' can be non-kinematic or kinematic. In some embodiments, the engagement can allow thermal expansion about the center of the wire guide 114. It will be appreciated that ear elements 115a-115c may not need to align with the notches 114a-114c.

FIGS. 4a-4e illustrate variants 110a-110e of the probe core 110, according to various embodiments. The probe core 110 can be shaped to indicate an orientation thereof. FIGS. 4a-4e show various geometries of shapes of the probe core 110. The dashed lines represent the extent of the second ends 113b of the probe wires 113 in the wire guide 114. The respective geometries of a top plate of the probe core 110 shown in FIGS. 4a-4e allow the probe core 110 to interface with a latch assembly or a handling tool in only one orientation.

The installation tool 130 of FIG. 1a can fit on the probe core 110 in a specific orientation such as, for example, the orientation as indicated by the specific shapes of the probe cores 110a-110e shown in FIGS. 4a-4e. The clamping mechanism 124 may not be engaged until the tool 130 is properly oriented and fully seated on the probe core 110.

Figure 5B:
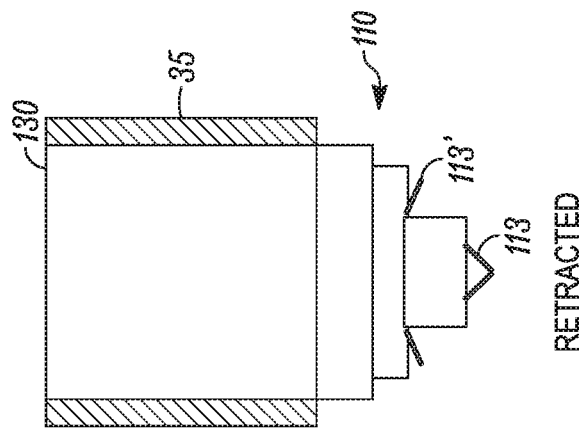
FIG. 5b is a side schematic view of the sleeve of FIG. 5a in a retracted position, according to some embodiments.
Figure 5A:
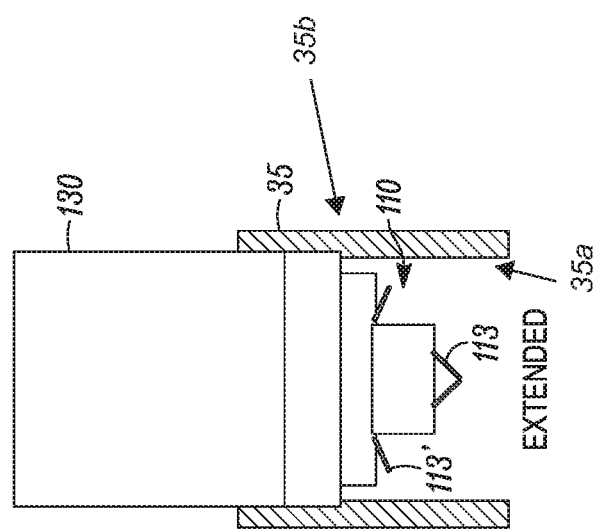
FIG. 5a is a side schematic view of a sleeve in an extending position, according to some embodiments.

The probe wires 113 can be protected from possible harm when the probe core 110 is contained in the tool 130. As shown in FIGS. 5a-5b, a protective sleeve 35 can protect the probe wires 113 and the probe wire tails 113'. The protective sleeve 35 can be latched in an extended position shown in FIG. 5a to cover the probe wires 113. The protective sleeve 35 can be released from the extended position to a retracted position shown in FIG. 5b when the installation tool 130 of FIG. 1a is inserted into the latch assembly 120 or a probe core carrier. In some embodiments, the sleeve 35 has an asymmetrical shape, and the respective inner profile 35a or outer profile 35b can act as a key. In some embodiments, the sleeve 35 can have a cylindrical shape that can be cost-effective. In the case of a symmetrical shape such as a cylinder, one or more slots in the side of the sleeve 35 could act as a key.

FIGS. 6a and 6b illustrate a probe test equipment 100 of FIG. 1a in an unclamped position and a clamped position, according to one embodiment. The clamping mechanism 124 includes a drive plate 24, a latch plate 26, and a resilient element 28 disposed between the drive plate 24 and the latch plate 26. The resilient element 28 can be, for example, a compression spring. The guide plate 125 is disposed between the clamping mechanism 124 and the circuit board 122 to provide a fine alignment between the probe core 110 and the circuit board 122. The guide plate 125 can be clamped to the circuit board 122 via, for example, screws. The drive plate 24 includes legs 624 with bearings 624a that contact a lower surface of the guide plate 125. The legs 624 extend through the latch plate 26 so that when the drive plate 24 rotates, the latch plate 26 can rotate with the drive plate 24. In the unclamped position, the latch plate 26 is initially pressed against the guide plate 125. When the latch plate 26 rotates along with the drive plate 24 and slides on the guide plate 125, profiled surfaces 524 on the latch plate 26 engage with the ear elements 115a-115c of the probe core 115. The latch plate 26 then pushes the probe core 110 down to the clamped position where the probe core 110 is fully seated against the circuit board 122 and the latch plate 26 is positioned on the top of the ear elements 115a-115c. In the clamped position, the wire guide 114 is firmly pressed by the clamping mechanism 124 against the circuit board 122. In some embodiments, the resilient element 28 can apply a force greater than, for example, 100% of the total force that the probe wires 113 can generate plus a wafer probing force, to positively bias the wire guide 114 against the circuit board 122 regardless of tolerance stack-ups or size changes over temperature. In some embodiments, a thin layer of, for example, polytetrafluoroethylene ("PTFE"), can be disposed between the latch plate 26 and the guide plate 125 to reduce friction therebetween. The PTFE can be in the form of a coating on a stick-on film that has high temperature adhesive. In some embodiments, between the latch plate 26 and the ear elements 115a-115c, respective engaging surfaces, for example, the profiled surfaces 524, can be hardened and polished, or coated with a lubricating film that can withstand very high loading from the small contact areas.

Figure 7:
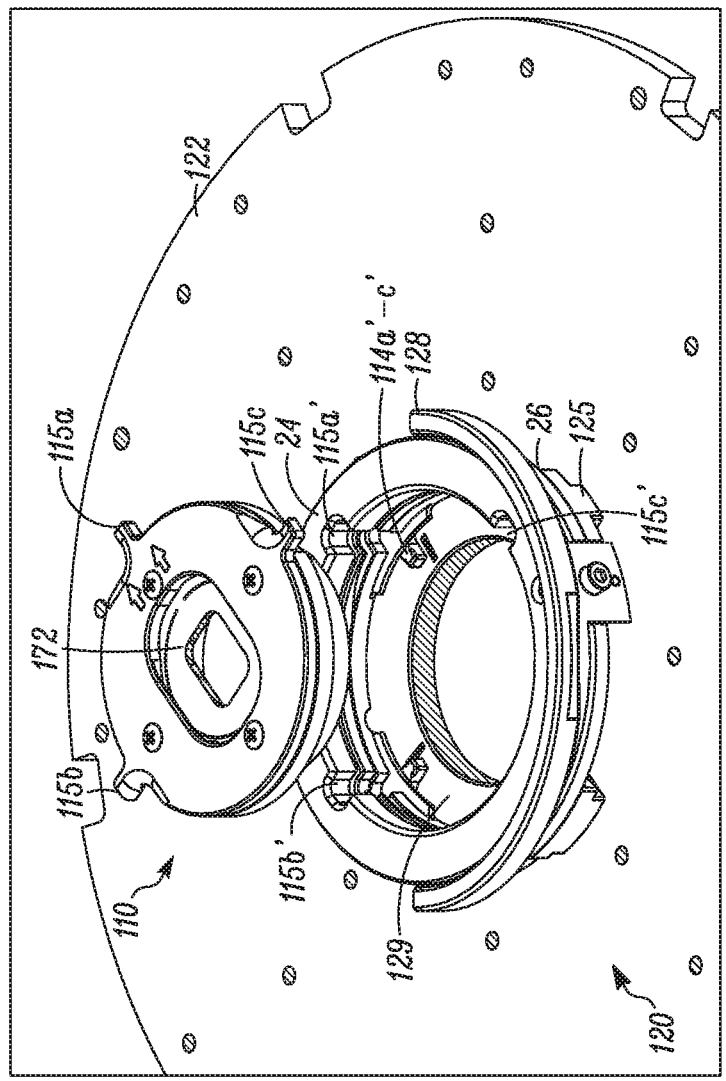
FIG. 7 is a perspective side view of a probe core and a latch assembly, according to some embodiments.

FIG. 7 is a perspective side view of the probe core 110 and the latch assembly 120. The latch assembly 120 defines a cavity 129 to receive the probe core 110. A handle 128 is connected to the drive plate 24. The handle 128 is configured to allow a user to rotate the drive plate 24 with respect to the guide plate 125. The drive plate 24 and the latch plate 26 include respective notches 115a'-115c' to receive the ear elements 115a-115c when the probe core 110 is inserted into the cavity 129 of the latch assembly 120. The latch assembly 120 includes fine alignment nubs 114a'-114c' located at an inner periphery of the guide plate 125. When the second ends 113b of the probe wires 113 approach the circuit board 122, the fine alignment nubs 114a'-114c' can engage respective notches 114a-114c of the probe core 110 shown in FIG. 3b.

Figure 8:
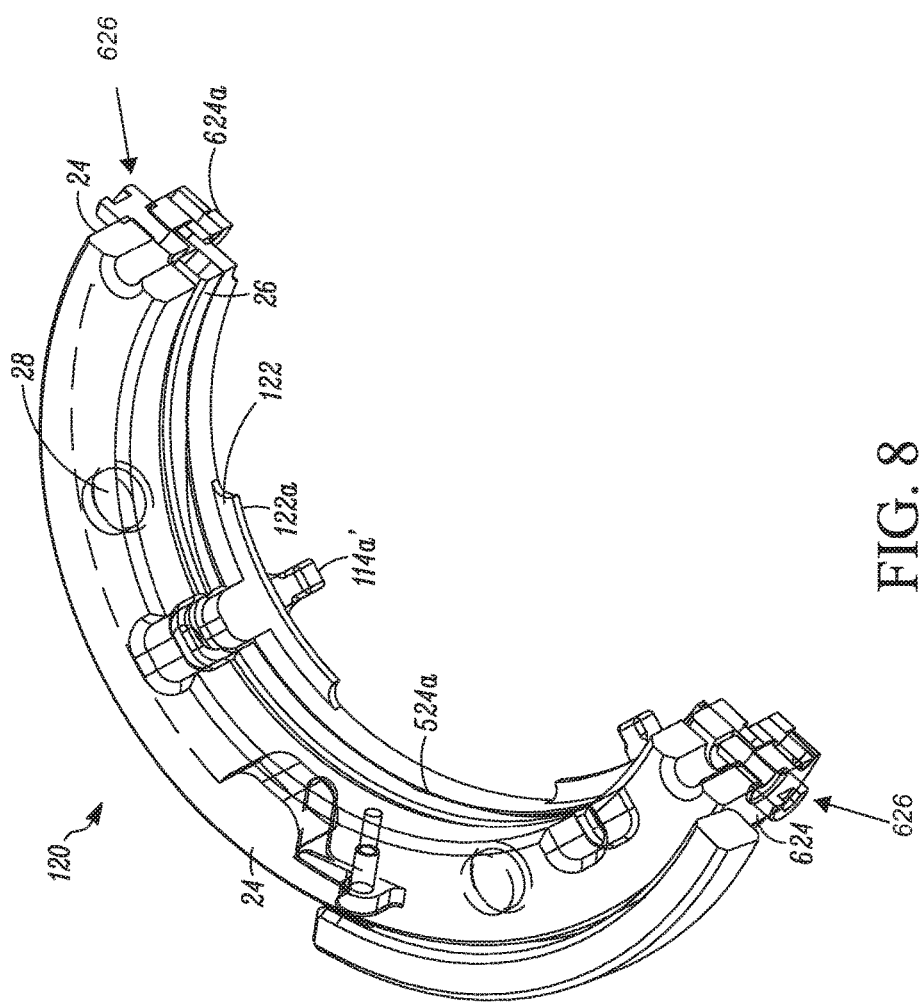
FIG. 8 is a sectional view of the latch assembly of FIG. 7, according to some embodiments.

FIG. 8 is a sectional view of the latch assembly 120 with the drive plate 24 shown to be transparent. The legs 624 of the drive plate 24 extend downward from the drive plate 24 through notches in the latch plate 26. As the drive plate 24 is rotated via the handle 128 or the installation tool 130 of FIG. 1a, the latch plate 26 rotates along with the drive plate 24 via the legs 624. The legs 624 also straddle the outer edge of the guide plate 122 to allow the drive plate 24 and the latch plate 26 to be aligned concentrically with the guide plate 122. Two of the legs 624 carry the ball bearings 624a that roll in a circumferential direction along the underside of the guide plate 122 (the legs 624, ball bearings 624a, and relative locations described in additional detail in accordance with FIGS. 6a-6b). The legs 624 also have plastic screws 626 parallel to axles of the ball bearing 624 that just clear the guide plate 122 and act as stops when the drive plate 24 is pushed down. The contoured lower face of the latch plate 122 includes one or more small recesses 524a that engage with the probe core ears 115a-115c in the latched position to help retain the latch position. As shown in FIG. 8, the small recess 524a is a small gap between the latch plate 26 and bottom/guide plate 122. The small gap can act as a detent to help lock the latch plate 26 in a closed position when the small recess 524*a* drops over the respective probe core ear 115*a*-115*c*.

The height of the probe core 110 can be minimized so that a high power microscope objective lens with about 30 mm of working distance can be used. When the drive plate 24 and the latch plate 26 are not in the correct position when the probe core 110 is inserted, the ear elements 115*a*-115*c* can still drop down through the notches 115*a'*-115*c'* in the drive plate 24 and the latch plate 26. The short vertical distance between the ear elements 115*a*-115*c* and the second ends 113*b* of the probe wires 113 can make it possible for the second ends 113*b* of the probe wires 113 to crash against the alignment nubs 114*a'*-114*c'* in the guide plate 122 before the ear elements 115*a*-115*c* land on the top face of the alignment nubs 114*a'*-114*c'*. The crash can cause a failure mode. The failure mode can be avoided by, for example, 1) adding a latch that keeps the latching plate 24 in correct (fully open) position when the probe core 110 is not locked down; 2) adding a guard above the top plate 115 to limit insertion/extraction orientation; or 3) adding a latch to the installation tool 130 to prevent insertion of the probe core 120 when the components are misaligned.

FIGS. 9*a*-9*d* illustrate the installation tool 130, according to one embodiment. The installation tool 130 is configured to grip or release the probe core 110 to/from the latch assembly 120. The installation tool 130 includes a handle subassembly and a sleeve subassembly. The handle subassembly includes a handle 31, a shaft 32 extending in an axial direction, a top part 33, and a pawl 34 that are connected to each other. The top part 33 includes pins 332 that extend downwardly. The sleeve subassembly includes a sleeve 35 with a safety interlock latch. The sleeve 35 can slide and rotate relative to the handle subassembly. A resilient element 36 is positioned between the first and second subassemblies to push the sleeve 35 against the pawl 34. The resilient element 36 can be, for example, a compression spring.

Figure 9B:
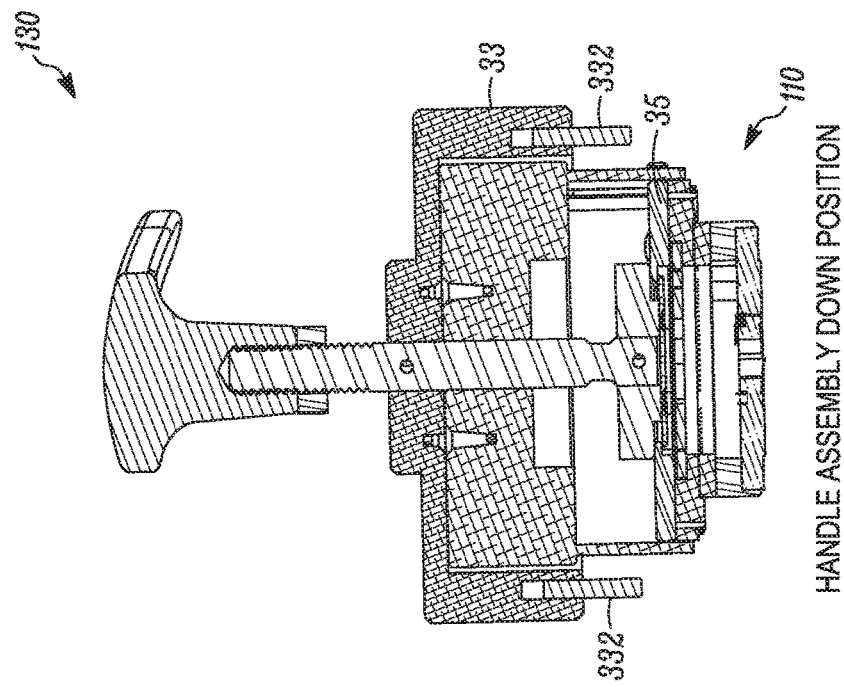
FIG. 9b is a sectional view of the installation tool of FIG. 9a in a down position, according to some embodiments.
Figure 9A:
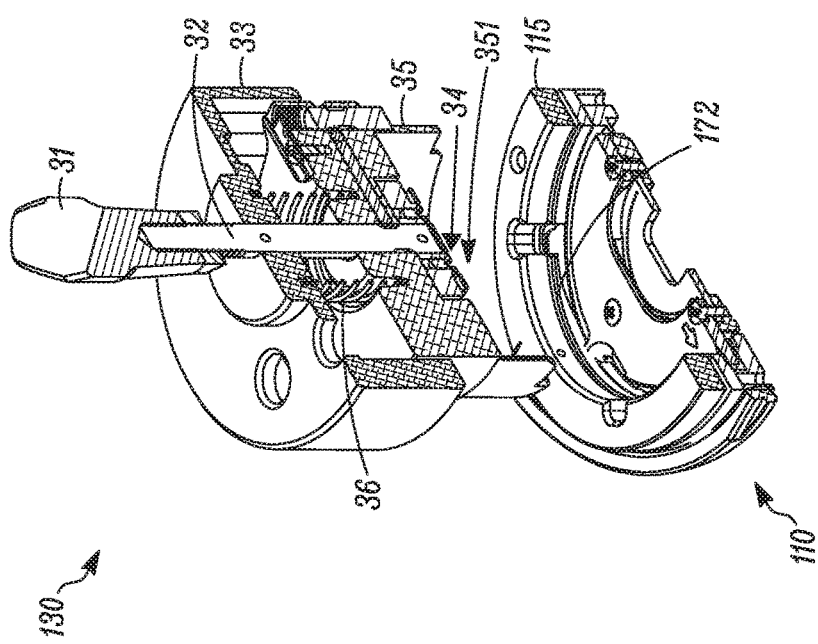
FIG. 9a is a sectional view of an installation tool in an up position, according to some embodiments.

The installation tool 130 in FIG. 9*a* is at an up position where the sleeve 35 is biased against the pawl 34. The installation tool 130 in FIG. 9*b* is at a down position where the sleeve 35 is forced up into contact with the top part 33. The ear elements 115*a*-115*c* of the probe core 110 (shown in FIG. 3*a*) are engaged in respective slots 351 of the sleeve 35. When the handle subassembly is rotated by a user via the handle 31, the pawl 34 can engage or disengage the pocket 172 of the top plate 115 of the probe core 110.

Figure 9C:
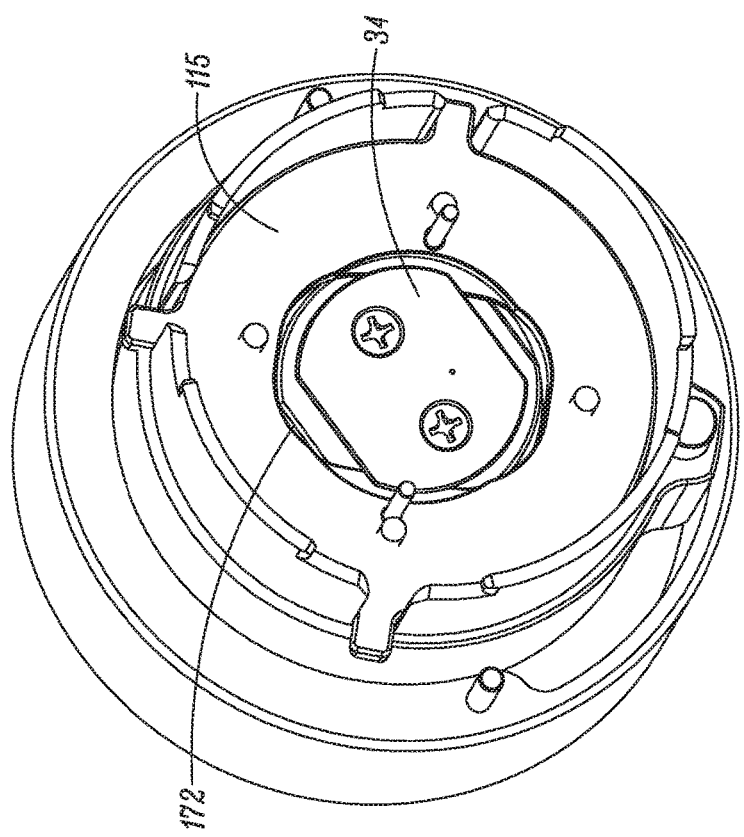
FIG. 9c is an end view of the installation tool of FIG. 9a with a top plate of a probe core.

FIG. 9*c* illustrates that the pawl 34 engages the top plate 115 of the probe core 110. The pocket 172 has a shape of a truncated circle. The pawl 34 is shaped such that, at a first position, the pawl 34 can pass through the truncated circle, and when the pawl 34 rotates with respect to the top plate 115 to a second position, the pawl 34 can capture the top plate and be secured to the probe core 110. In some embodiments, the pawl 34 rotates about 45 degrees from the first position to the second position.

Figure 9D:
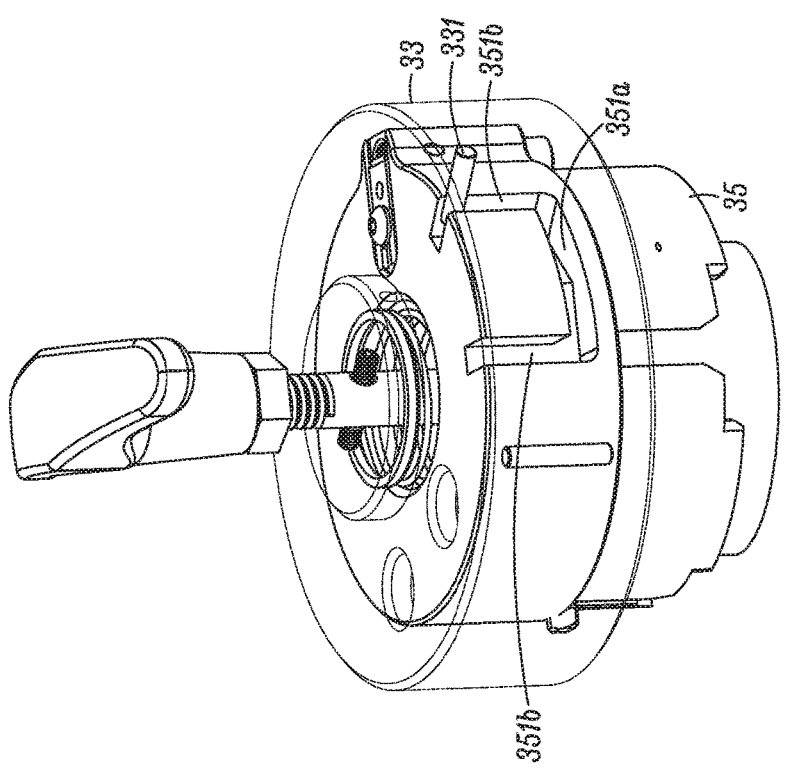
FIG. 9d is a side perspective view of the installation tool of FIG. 9a, according to some embodiments.

FIG. 9*d* illustrates an interlock mechanism between the top part 33 and the sleeve 35 with the top part 33 shown to be transparent. The interlock mechanism includes a pin 331 at a side of the top part 33, and a groove 351 at a side of the sleeve 35. The groove 351 includes a lateral portion 351*a* and vertical portions 351*b* at ends of the lateral portion 351*a* that form a U shape. When the pin 331 engages with the lateral portion 351 of the groove 351, a vertical motion of the sleeve 35 can be prevented. When the pin 331 engages with one of the vertical portions 351*a*-351*b*, the sleeve 35 can move downward in the axial direction. The interlock mechanism can prevent the handle subassembly from lifting part way between "grab" and "release" positions.

Figure 10D:
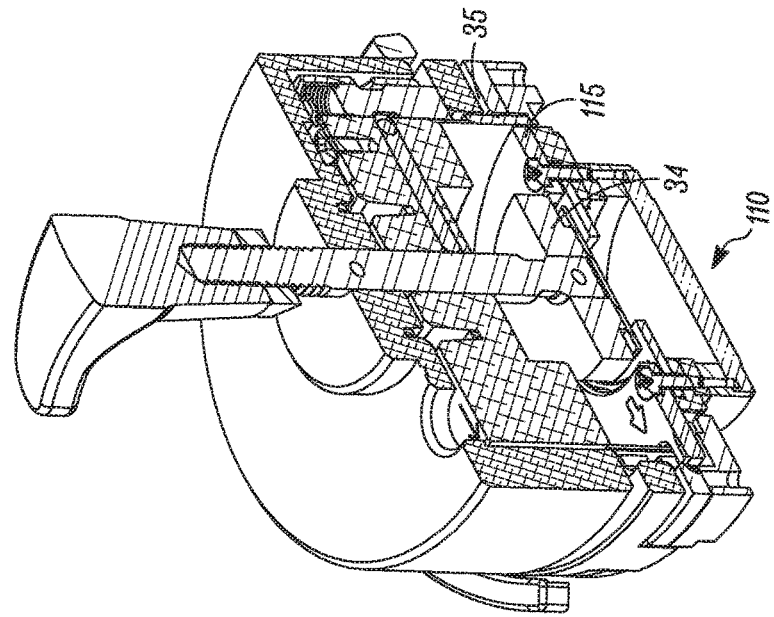
FIG. 10d is another sectional view of the installation tool of FIG. 9a that engages with a probe core and a latch assembly, according to some embodiments.
Figure 10C:
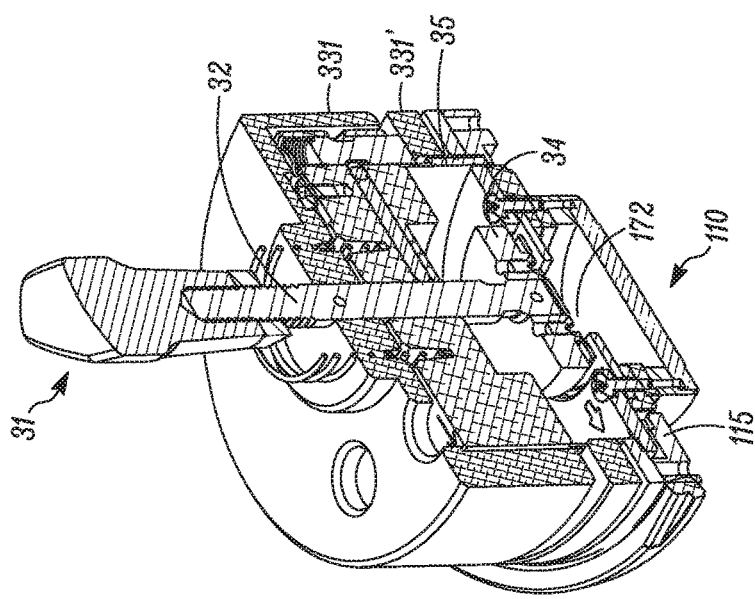
FIG. 10c is another sectional view of the installation tool of FIG. 9a that engages with a probe core and a latch assembly, according to some embodiments.
Figure 10F:
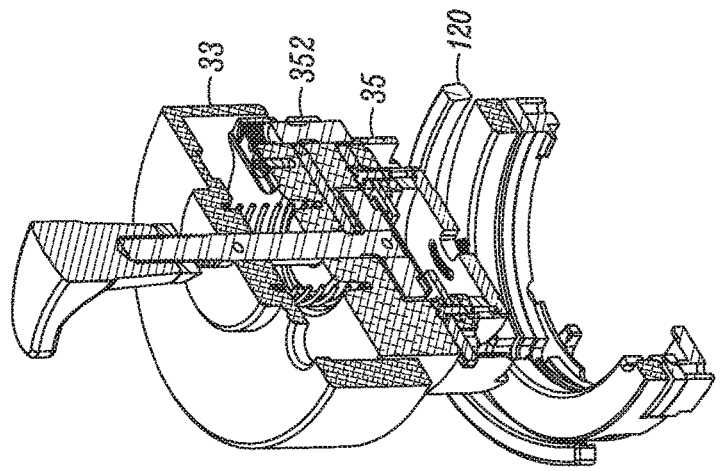
FIG. 10f is another sectional view of the installation tool of FIG. 9a that engages with a probe core and a latch assembly, according to some embodiments.
Figure 10E:
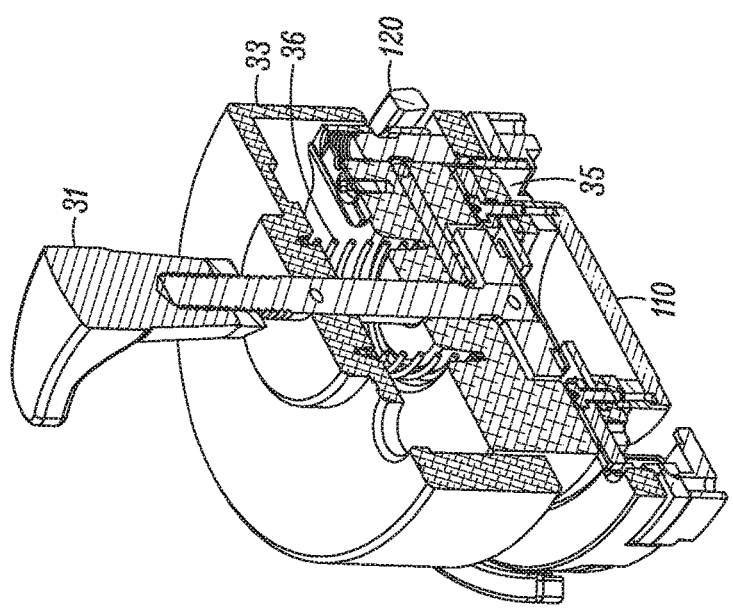
FIG. 10e is another sectional view of the installation tool of FIG. 9a that engages with a probe core and a latch assembly, according to some embodiments.

FIGS. 10*a*-10*f* illustrate how the installation tool 130 transitions from gripping to releasing of the probe core 110 when the latch assembly 120 transitions from unclamping to clamping of the probe core 110. In FIG. 10*a*, the installation tool 130 is empty and approaches the probe core 110 received in the latch assembly 120. The latch assembly 120 can press the core 110 against a circuit board (not shown). The sleeve 35 is rigidly locked to the handle subassembly by a sleeve latch 352 (see FIG. 10*b*). When the installation tool 130 is slid down over the probe core 110, slots 351 (see FIG. 10*a*) in the sleeve can be aligned with the ear elements 115*a*-115*c* on the top plate 115 of the probe core 110 (see FIGS. 10*b* and 3*a*). When the sleeve 35 fully settles on the probe core 110, the sleeve latch 352 (see FIG. 10*b*) can be released to allow the handle subassembly to drop down (see FIG. 10*c*). The resilient element 36 can still provide resistance to further downward motion of the handle subassembly. At the bottom of the handle travel, the pawl 34 stops against the top of the probe core 110 with part of the pawl 34 protruding into the recessed cavity 172 in the top plate 115 of the probe core 110. The pins 332 (see FIG. 10*a*) in the tool top part also engage with holes 332' (see FIG. 10*a*) in the driving plate 24 of the latch assembly 120. Rotating the handle 31 about 45 degrees can simultaneously rotate the pawl 34 of the tool 130 and the top plate 24 of the latch assembly 120 to lock the probe core 110 to the installation tool 130 and release the probe core 110 from the latch assembly 120 (see FIG. 10*d*). Then the installation tool 130 and the probe core 110 are lifted up from the latch assembly 120 (see FIG. 10*e*). The resilient element 36 (see FIG. 10*e*) can hold the sleeve 35 against the latch assembly 120 until the top of the probe core 110 contacts the bottom of the sleeve 35. With further upward motion, the sleeve latch 352 drops down to lock the sleeve 35 in the down position to protect the probe core 110 (see FIG. 10*f*).

Figure 10G:
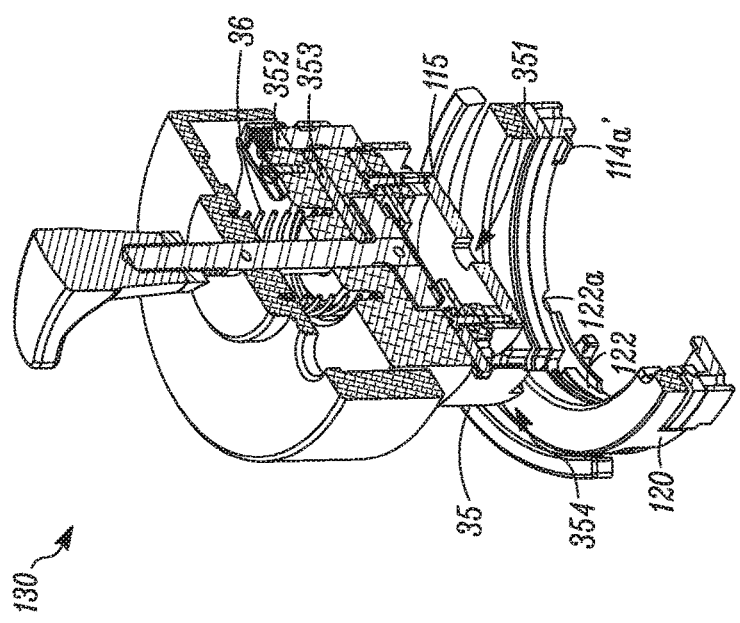
FIG. 10g is another sectional view of the installation tool of FIG. 9a that engages with a probe core and a latch assembly, according to some embodiments.

FIG. 10*g* is a sectional view of the installation tool 130 that engages with the top plate 115 of the probe core 110. Sleeve guide features 354 on the end of the sleeve 35 can engage with features 122*a* in the guide plate 122 of the latch assembly 120. When the sleeve 35 is not correctly aligned with respect to the latch assembly 120, the sleeve 35 cannot enter the latch assembly 120 far enough to actuate the latch assembly 120 and the probe core 110 cannot drop into the latch assembly 120. This can prevent the probe tails 113' from coming down on top of the latch fine alignment nubs 114*a'*-114*c'* when the probe core 110 and the latch assembly 120 are not properly aligned. This also helps protect the probes 113 during handling.

Figure 11:
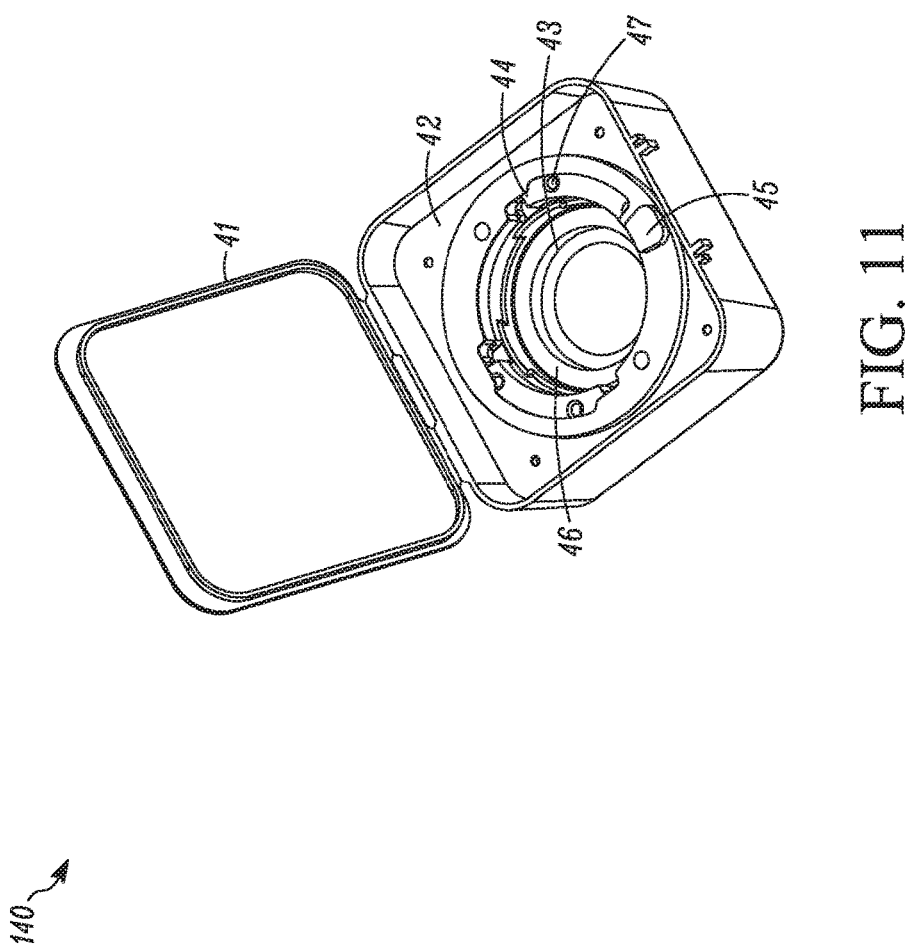
FIG. 11 is a perspective view of a probe core carrier, according to some embodiments.

FIG. 11 shows a probe core carrier 140 that can protect the probe core 110 during shipping and handling. The probe core carrier 140 can include a box 41. Inside the box 41, an upper part 42 and a lower part 43 are formed to contain the probe core 110. Holes 47 in a latch disc 44 can engage the pins 332 in the top part 33 of the installation tool 130. The upper part 42 includes a raised area 45 to actuate the sleeve latch 352. The lower part 43 includes sleeve alignment features 46 that are engageable with the sleeve guide feature 354 of the sleeve 35. The installation tool 130 can operate in the same way at the probe core carrier 140 as it does with the latch assembly 120.

Figure 12A:
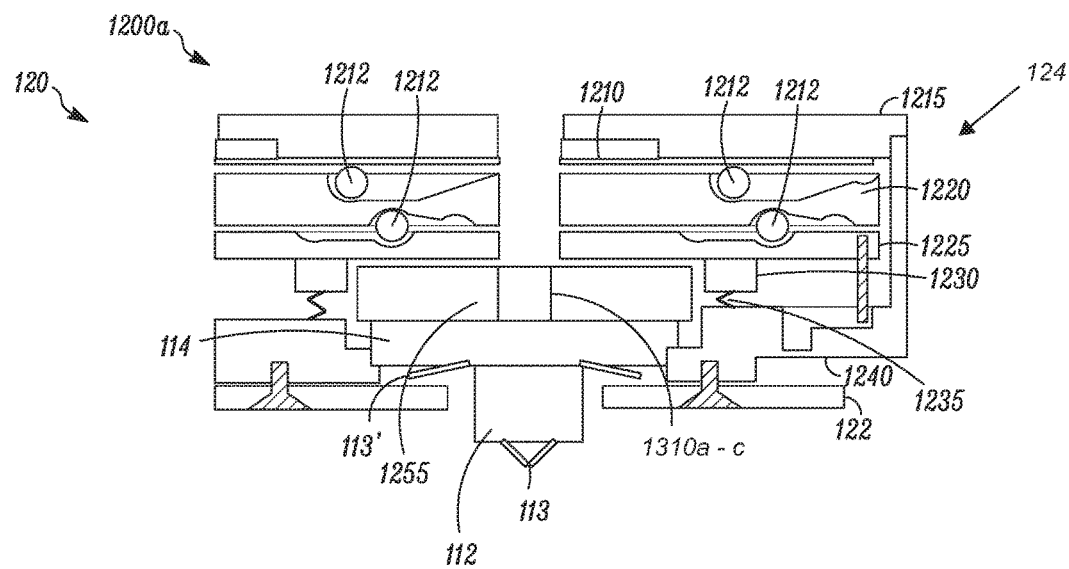
FIG. 12a is a side schematic view of the probe test equipment of FIG. 1a in an unclamped position, according to some embodiments.
Figure 12B:
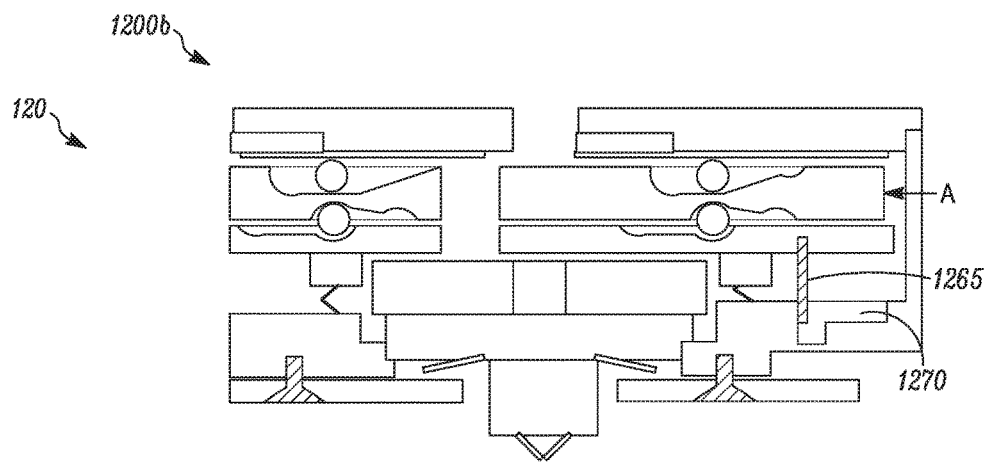
FIG. 12b is a side schematic view of the probe test equipment of FIG. 1a in an intermediate position, according to some embodiments.
Figure 12C:
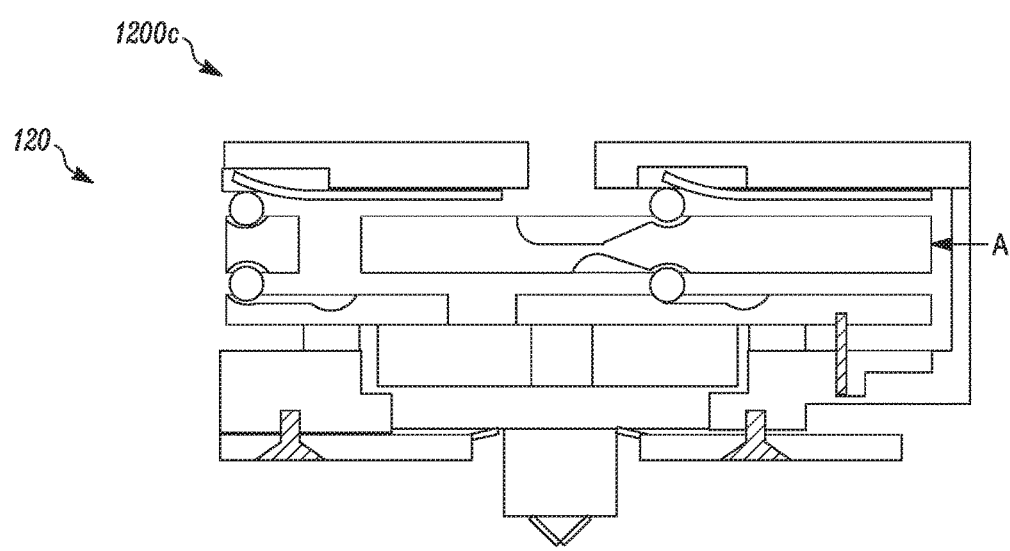
FIG. 12c is a side schematic view of the probe test equipment of FIG. 1a in a clamped position, according to some embodiments.

FIGS. 12*a*-12*c* illustrate side schematic views 1200*a*-1200*c* of the probe test equipment 100 of FIG. 1*a* in an unclamped position 1200*a*, an intermediate position 1200*b*, and a clamped position 1200*c*, according to some embodiments. The embodiment illustrated in FIGS. 12*a*-12*c* can be, for example, an alternative to the embodiment illustrated in FIGS. 6a-6b. Aspects of FIGS. 12a-12c can be the same as or similar to aspects of FIGS. 6a-6b. The latch assembly 120 illustrated in FIGS. 12a-12c can be configured to be used with the probe core having the probe core top plate 1305 illustrated in FIG. 13.

The clamping mechanism 124 includes a drive plate 1220, a latch plate 1225, a resilient element 1210, and rolling elements 1212. The resilient element 1210 can be, for example, a cantilever spring. A guide plate 1240 is disposed between the clamping mechanism 124 and the circuit board 122 to provide a fine alignment between the probe core 110 and the circuit board 122. The guide plate 1240 can be clamped to the circuit board 122 via, for example, screws. In the latch assembly 120 illustrated in FIGS. 12a-12c, a clamping top plate 1215 is attached to the guide plate 1240. The resilient element 1210 can be attached to the clamping top plate 1215. The resilient element 1210 is configured to restrain upward motion. The resilient element 1210 is generally selected so that, when deflected, the resilient element 1210 counteracts lift force, probe core 110—circuit board 122 contact force, and forces generated when the probe wires 113 contact a device under test. In some embodiments, portions of the resilient element 1210 can be supported by the clamping top plate 1215 to prevent deformation of the resilient element 1210.

The drive plate 1220 and the latch plate 1225 are profiled such that the rolling elements 1212 cause the latch plate 1225 to rotate with the drive plate 1220. The profiles include dimples designed such that the drive plate 1220 and the latch plate 1225 move together during motion of the drive plate 1220 and relative to each other during portions of the motion of the drive plate 1220. Lift springs 1235 provide a force sufficient to force the drive plate 1220, the latch plate 1225, and the rolling elements 1212 together, while the resilient element 1210 restrains upward motion. In some embodiments, the profiled surfaces of the drive plate 1220 and the latch plate 1225 can be hardened and polished, or coated with a lubricating film that can withstand very high loading from the contact areas.

When the latch plate 1225 rotates along with the drive plate 1220 and slides along a PTFE glide pad 1230 in the A direction, profiled surfaces on the latch plate 1225 and the drive plate 1220 engage with the rolling elements 1212. The latch plate 1225 then pushes the probe core 110 down to the clamped position where the probe core 110 is fully seated against the circuit board 1222 and the latch plate 1225 is positioned on top of engagement elements 1310a-1310c. In the illustrated embodiment, the engagement elements 1310a-1310c are lobe elements 1310a-1310c. A latch plate stop pin 1265 is attached to the latch plate 1235. The latch plate stop pin 1265 is configured to translate in the A direction along with the latch plate 1225. A portion of the latch plate stop pin 1265 is disposed within a slot 1270 in the guide plate 1240. The slot 1270 provides a stop in the clamped position 1200c and in the unclamped position 1200a and can prevent unwanted motion of the latch plate 1225.

In the clamped position, the wire guide 114 is firmly pressed by the clamping mechanism 124 against the circuit board 122. In some embodiments, the resilient element 1210 can apply a force greater than, for example, 100% of the total force that the probe wires 113 can generate plus a wafer probing force, to positively bias the wire guide 114 against the circuit board 122 regardless of tolerance stack-ups or size changes over temperature.

Figure 13:
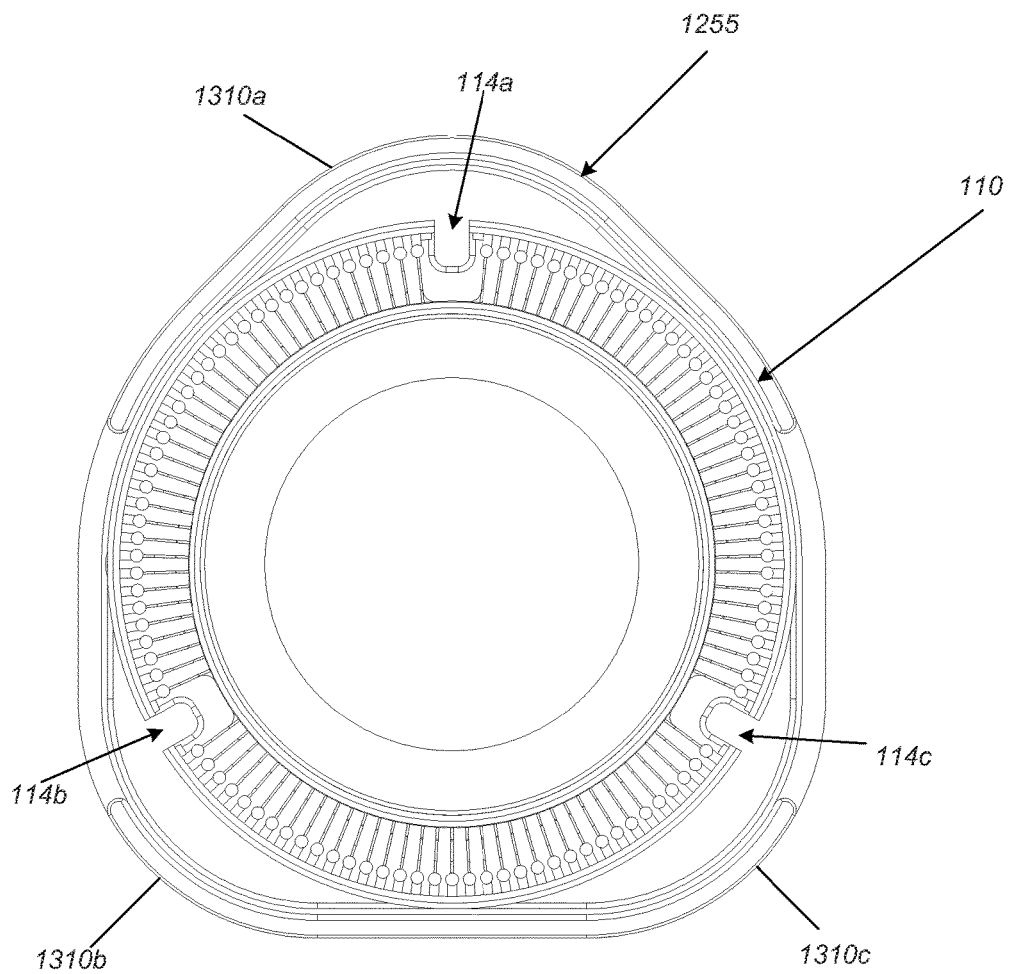
FIG. 13 illustrates a bottom view of the probe core 110, according to some embodiments.

FIG. 13 illustrates a bottom view of the probe core 110, according to some embodiments. The top plate 1255 of the probe core 110 has a generally rounded arrow shape (e.g., similar to 110c of FIG. 4c) and lobe elements 1310a-1310c extending beyond the periphery of the probe tile 112 and wire guide 114. The lobe elements 1310a-1310c on the top plate 1255 can provide a positive orientation, act as coarse alignment features, and can be engaged by a latch such as, for example, the clamping mechanism 124 of FIG. 1a, to push the second end 113b of the probe wires 113 against the circuit board 122. The wire guide 114 of the probe core 110 includes notches 114a-114c positioned at the periphery of the wire guide 114. The notches 114a-114c can provide fine alignment features for the wire guide 114. In some embodiments, the notches 114a-114c can engage with nubs such as nubs 114a'-114c' shown in FIG. 7 on the guide plate 125 to provide a fine alignment therebetween. The engagement between the notches 114a-114c and the nubs 114a'-114c' can be non-kinematic or kinematic. In some embodiments, the engagement can allow thermal expansion about the center of the wire guide 114. It will be appreciated that lobe elements 1310a-1310c may not need to align with the notches 114a-114c.

The numerous innovative teachings of the present application have been set forth above with particular reference to presently preferred but exemplary embodiments, wherein these innovative teachings are advantageously applied to the particular problems of easily interchangeable probe cores and handling tools for probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Aspects:

It is to be appreciated that any of aspects 1-9 can be combined with any of aspects 10-14, 15-19, or 20-23. Any of aspects 10-14 can be combined with any of aspects 15-19 or 20-23. Any of aspects 15-19 can be combined with any of aspects 20-23.

Aspect 1. A probe apparatus for testing a device under test, the apparatus comprising:
 a probe core including a top plate, a wire guide, a plurality of probe wires, and a probe tile;
 a circuit board; and
 a latch assembly for removably securing the probe core to the circuit board, including:
  a clamping mechanism configured to press the probe core against the circuit board; and
  a guide plate disposed between the clamping mechanism and the circuit board, the guide plate configured to orient the probe core with respect to the circuit board in a specific position.

Aspect 2. The probe apparatus according to aspect 1, wherein the guide plate is clamped to the circuit board.

Aspect 3. The probe apparatus according to any of aspects 1-2, wherein the latch assembly includes one or more fine alignment nubs located at an inner periphery of the guide plate.

Aspect 4. The probe apparatus according to any of aspects 1-3, wherein the probe core includes one or more notches engageable with one or more fine alignment nubs to provide a particular alignment of the probe core with respect to the circuit board.

Aspect 5. The probe apparatus according to any of aspects 1-4, wherein the clamping mechanism includes:
a drive plate configured to rotate with respect to the circuit board;
a latch plate disposed between the drive plate and the circuit board and in slideable contact with the guide plate; and
a resilient element disposed between the drive plate and the latch plate,
wherein the latch plate is configured to rotate with the drive plate and slide with respect to the guide plate, the latch plate engageable with one or more engagement elements of the probe core to provide a clamping force, thereby maintaining the probe core in a clamped position.

Aspect 6. The probe apparatus according to any of aspects 1-4, wherein the clamping mechanism includes:
a drive plate configured to rotate with respect to the circuit board;
a glide pad attached to the guide plate via a compression spring;
a latch plate disposed between the drive plate and the circuit board and in slideable contact with the glide pad;
a clamping top plate attached to the guide plate; and
a resilient element disposed between the clamping top plate and the drive plate,
wherein the latch plate is configured to rotate with the drive plate and slide with respect to the guide plate, the latch plate engageable with one or more engagement elements of the probe core to provide a clamping force, thereby maintaining the probe core in a clamped position.

Aspect 7. The probe apparatus according to aspects 1-6, further comprising a latch plate stop pin configured to limit motion of the latch plate with respect to the circuit board, the stop pin disposed within a slot in the guide plate.

Aspect 8. The probe apparatus according to any of aspects 1-7, further comprising a handling tool engageable with the clamping mechanism.

Aspect 9. The probe apparatus according to any of aspects 6-8, wherein the latch assembly is actuated by rotating the latch plate.

Aspect 10. A probe apparatus for testing a device under test, the apparatus comprising:
a circuit board having an engagement assembly; and
a probe core including:
a top plate including one or more engagement elements configured to provide a coarse alignment of the probe core with respect to the circuit board when the probe core is clamped to the circuit board;
a wire guide including one or more notches positioned at a periphery of the wire guide, the one or more notches configured to provide a fine alignment when the probe core is clamped to the circuit board;
a plurality of probe wires; and
a probe tile,
wherein the probe core is engageable with the engagement assembly.

Aspect 11. The probe apparatus according to aspect 10, wherein the engagement assembly includes:
a clamping mechanism configured to press the probe core against the circuit board; and
a guide plate disposed between the clamping mechanism and the circuit board, the guide plate configured to orient the probe core with respect to the circuit board in a specific position.

Aspect 12. The probe apparatus according to any of aspects 10-11, wherein the probe core is engaged with the engagement assembly when the probe apparatus is in a test configuration.

Aspect 13. The probe apparatus according to any of aspects 10-12, wherein the top plate comprises a geometry configured to indicate an engageable orientation of the probe core with respect to the engagement assembly.

Aspect 14. The probe apparatus according to any of aspects 10-13, wherein the engagement assembly is clamped to the circuit board.

Aspect 15. A probe core configured for use in a probe apparatus for testing a device under test, the probe core comprising:
a top plate including one or more engagement elements configured to provide a coarse alignment of the probe core with respect to a circuit board when the probe core is clamped to the circuit board;
a wire guide including one or more notches positioned at a periphery of the wire guide, the one or more notches configured to provide a fine alignment when the probe core is clamped to the circuit board;
a plurality of probe wires; and
a probe tile,
wherein the probe core is engageable with an engagement assembly.

Aspect 16. The probe core according to aspect 15, wherein the engagement assembly is a latch assembly configured to hold the probe core to the circuit board.

Aspect 17. The probe core according to aspect 15, wherein the engagement assembly is a handling tool.

Aspect 18. The probe core according to aspect 15, wherein the engagement assembly is a probe core carrier.

Aspect 19. The probe core according to any of aspects 15-18, wherein the top plate comprises a geometry configured to indicate an engageable orientation of the probe core with respect to the engagement assembly.

Aspect 20. A method for latching a probe core to a device, the method comprising:
applying a force to a drive plate using an installation tool, the drive plate being configured to correspondingly rotate a latch plate;
forcing the latch plate against an engagement element on the probe core thereby clamping the probe core to the device; and
removing the installation tool from the probe core when the probe core is clamped to the device.

Aspect 21. The method according to aspect 20, wherein applying the force includes a combination of applying a downward and a rotational force to the drive plate.

Aspect 22. The method according to any of aspects 20-21, wherein the device includes one of a circuit board or a probe core carrier.

Aspect 23. The method according to any of aspects 20-22, further comprising fixing one or more portions of a latch assembly to the device before latching the probe core to the device.

The following terms have been particularly described throughout the description and are not intended to be limiting:

Semiconductor Device Not Limiting

The present disclosure is particularly suitable for probing semiconductor devices, but the use of the present teachings is not limited to probing semiconductor devices. Other devices may be applied to the present disclosure teachings. Thus, while this specification speaks in terms of probing "semiconductor" devices, this term should be interpreted broadly to include probing any suitable device.

Low Current Not Limiting

The present disclosure can be applied with other testing equipment to solve the problem of measuring currents below 100 fA, but the current range of the present teachings is not limited to below 100 fA. For example, the present disclosure may be applied with other testing equipment to measure the currents at or above 100 fA in a semiconductor device. Thus, while this specification speaks in terms of "low currents" or "measuring currents below 100 fA," these terms should be interpreted broadly to include any current that flows through a semiconductor device which could be at or above 100 fA. The present disclosure can also be applied with other testing equipment to solve the problem of measuring high frequency signals at high temperatures.

Wide Temperature Not Limiting

The present disclosure can solve the problem of easily interchangeable probe cores for use in a narrow or limited operating temperature range. The present teachings do not limit to a specific operating temperature range. The present application allows a tester to electrically probe semiconductor devices over a wide operating temperature range, not only at a low operating temperature but also at a high operating temperature, e.g. an operating temperature up to 300° C. and beyond. Thus, while this specification speaks in terms of "wide temperature range" or "measuring currents in a wide operating temperature range," these terms should be interpreted broadly to include any suitable operating or testing temperature range of a semiconductor device.

Probe Not Limiting

The present disclosure can solve the problem of interconnecting a device under test (e.g., a semiconductor wafer) with a circuit board by using a probe, for example, a wire needle probe that extends from the needle tip that contacts the wafer to a formed probe wire tail that contacts the circuit board. However, nothing in the teachings of the present disclosure limits application of other probe technologies for contacting the wafer, other electrical contact technologies for contacting the probe card or other electrical interconnects between the wafer and circuit board contacts.

Signal Contact/Cable and Guard Contact/Cable Not Limiting

The present disclosure can be applied with a signal contact/cable and/or a guard contact/cable to solve the problem of measuring currents of a semiconductor device using a co-axial or a tri-axial signal cable. However, nothing in the teachings of herein limits application of the teachings of the present disclosure to a signal cable with more or less layers. Advantageous use of the teachings herein may be had with a signal cable of any number of layers.

Metals Not Limiting

The present disclosure can be applied with a needle and a driven guard that can be made of metal(s). The present disclosure does not recognize any limitations in regards to what types of metals may be used in affecting the teachings herein. One skilled in the art will recognize that any conductive material may be used with no loss of generality in implementing the teachings of the present disclosure.

Dielectric Not Limiting

The present disclosure can be applied with various dielectric materials, for example, for providing an electrical insulation between components. The present disclosure does not recognize any limitations in regards to what types of dielectric may be used in affecting the teachings herein. One skilled in the art will recognize that any non-conductive, highly heat-resistant material may be used with no loss of generality in implementing the teachings of the present disclosure.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A probe apparatus for testing a device under test, the apparatus comprising:
    a probe core including a top plate, a wire guide, a plurality of probe wires, and a probe tile;
    a circuit board; and
    a latch assembly for removably securing the probe core to the circuit board, including:
        a clamping mechanism configured to press the probe core against the circuit board;
        a guide plate disposed between the clamping mechanism and the circuit board, the guide plate configured to orient the probe core with respect to the circuit board in a specific position; and
        one or more fine alignment nubs located at an inner periphery of the guide plate.

2. The probe apparatus according to claim 1, wherein the guide plate is clamped to the circuit board.

3. The probe apparatus according to claim 1, wherein the probe core includes one or more notches engageable with the one or more fine alignment nubs to provide a particular alignment of the probe core with respect to the circuit board.

4. The probe apparatus according to claim 1, wherein the clamping mechanism includes:
    a drive plate configured to rotate with respect to the circuit board;
    a latch plate disposed between the drive plate and the circuit board and in slideable contact with the guide plate; and
    a resilient element disposed between the drive plate and the latch plate,
    wherein the latch plate is configured to rotate with the drive plate and slide with respect to the guide plate, the latch plate engageable with one or more engagement elements of the probe core to provide a clamping force, thereby maintaining the probe core in a clamped position.

5. The probe apparatus according to claim 1, wherein the clamping mechanism includes:
    a drive plate configured to rotate with respect to the circuit board;
    a glide pad attached to the guide plate via a compression spring;
    a latch plate disposed between the drive plate and the circuit board and in slideable contact with the glide pad;
    a clamping top plate attached to the guide plate; and
    a resilient element disposed between the clamping top plate and the drive plate,
    wherein the latch plate is configured to rotate with the drive plate and slide with respect to the guide plate, the latch plate engageable with one or more engagement elements of the probe core to provide a clamping force, thereby maintaining the probe core in a clamped position.

6. The probe apparatus according to claim 5, further comprising a latch plate stop pin configured to limit motion of the latch plate with respect to the circuit board, the latch plate stop pin disposed within a slot in the guide plate.

7. The probe apparatus according to claim 1, further comprising a handling tool engageable with the clamping mechanism.

8. The probe apparatus according to claim 5, wherein the latch assembly is actuated by rotating the latch plate.

9. A probe apparatus for testing a device under test, the apparatus comprising:
- a circuit board having an engagement assembly; and
- a probe core including:
  - a top plate including one or more engagement elements configured to provide a coarse alignment of the probe core with respect to the circuit board when the probe core is clamped to the circuit board;
  - a wire guide including one or more notches positioned at a periphery of the wire guide, the one or more notches configured to provide a fine alignment when the probe core is clamped to the circuit board;
  - a plurality of probe wires; and
  - a probe tile,
- wherein the probe core is engageable with the engagement assembly.

10. The probe apparatus according to claim 9, wherein the engagement assembly includes:
- a clamping mechanism configured to press the probe core against the circuit board; and
- a guide plate disposed between the clamping mechanism and the circuit board, the guide plate configured to orient the probe core with respect to the circuit board in a specific position.

11. The probe apparatus according to claim 9, wherein the probe core is engaged with the engagement assembly when the probe apparatus is in a test configuration.

12. The probe apparatus according to claim 9, wherein the top plate comprises a geometry configured to indicate an engageable orientation of the probe core with respect to the engagement assembly.

13. The probe apparatus according to claim 9, wherein the engagement assembly is clamped to the circuit board.

14. A probe core configured for use in a probe apparatus for testing a device under test, the probe core comprising:
- a top plate including one or more engagement elements configured to provide a coarse alignment of the probe core with respect to a circuit board when the probe core is clamped to the circuit board;
- a wire guide including one or more notches positioned at a periphery of the wire guide, the one or more notches configured to provide a fine alignment when the probe core is clamped to the circuit board;
- a plurality of probe wires; and
- a probe tile,
- wherein the probe core is engageable with an engagement assembly.

15. The probe core according to claim 14, wherein the engagement assembly is a latch assembly configured to hold the probe core to the circuit board.

16. The probe core according to claim 14, wherein the engagement assembly is a handling tool.

17. The probe core according to claim 14, wherein the engagement assembly is a probe core carrier.

18. The probe core according to claim 14, wherein the top plate comprises a geometry configured to indicate an engageable orientation of the probe core with respect to the engagement assembly.

19. A method for latching a probe core to a device, the method comprising:
- engaging the probe core via one or more fine alignment nubs located at an inner periphery of a guide plate to provide a particular alignment of the probe core with respect to the device;
- applying a force to a drive plate using an installation tool, the drive plate being configured to correspondingly rotate a latch plate;
- forcing the latch plate against an engagement element on the probe core thereby clamping the probe core to the device; and
- removing the installation tool from the probe core when the probe core is clamped to the device.

20. The method according to claim 19, wherein applying the force includes a combination of applying a downward and a rotational force to the drive plate.

21. The method according to claim 19, wherein the device includes one of a circuit board or a probe core carrier.

22. The method according to claim 19, further comprising fixing one or more portions of a latch assembly to the device before latching the probe core to the device.

* * * * *